United States Patent
Lu et al.

(10) Patent No.: US 12,068,020 B2
(45) Date of Patent: Aug. 20, 2024

(54) DYNAMIC MEMORY WITH SUSTAINABLE STORAGE ARCHITECTURE AND CLEAN UP CIRCUIT

(71) Applicants: Etron Technology, Inc., Hsinchu (TW); Invention And Collaboration Laboratory Pte. Ltd., Singapore (SG)

(72) Inventors: Chao-Chun Lu, Taipei (TW); Chun Shiah, Hsinchu (TW); Bor-Doou Rong, Hsinchu County (TW)

(73) Assignees: Etron Technology, Inc., Hsinchu (TW); Invention And Collaboration Laboratory Pte. Ltd., Singapore (SG)

( * ) Notice: Subject to any disclaimer, the term of this patent is extended or adjusted under 35 U.S.C. 154(b) by 79 days.

(21) Appl. No.: 17/574,494

(22) Filed: Jan. 12, 2022

(65) Prior Publication Data
US 2022/0246192 A1  Aug. 4, 2022

Related U.S. Application Data

(63) Continuation-in-part of application No. 16/354,187, filed on Mar. 15, 2019, now Pat. No. 11,302,383.
(Continued)

(51) Int. Cl.
 *G11C 11/4074* (2006.01)
 *G11C 11/406* (2006.01)
(Continued)

(52) U.S. Cl.
CPC ........ *G11C 11/4074* (2013.01); *G11C 11/406* (2013.01); *G11C 11/4085* (2013.01); *G11C 11/4091* (2013.01); *G11C 11/4094* (2013.01)

(58) Field of Classification Search
CPC .............. G11C 11/4074; G11C 11/406; G11C 11/4091
(Continued)

(56) References Cited

U.S. PATENT DOCUMENTS 5,353,255 A   10/1994  Komuro
5,675,529 A   10/1997  Poole
(Continued)

FOREIGN PATENT DOCUMENTS

JP   2000-164813 A   6/2000
JP   2003-228981 A   8/2003
(Continued)

OTHER PUBLICATIONS

Kyungjun Cho et al., Signal Integrity Design and Analysis of Silicon Interposer for GPU-Memory Channels in High-Bandwidth Memory Interface, IEEE Transactions on Components, Packaging and Manufacturing Technology, vol. 8, No. 9, Sep. 2018, pp. 1658-1671 ,Sep. 2018.

*Primary Examiner* — Anthan Tran
(74) *Attorney, Agent, or Firm* — Winston Hsu

(57) ABSTRACT

The invention relates to DRAM with sustainable storage architecture. The DRAM comprises a first supplying voltage source generating a voltage level corresponding to signal ONE utilized in the DRAM chip, and a DRAM cell which includes an access transistor and a storage capacitor. Wherein a first voltage level is higher than the voltage level corresponding to signal ONE, and the first voltage level is generated by a first sustaining voltage generator. The first sustaining voltage generator is electrically coupled to the storage capacitor of the DRAM cell during a turning-off period of the access transistor of the DRAM cell. A clean up circuit is provided to mitigate the difference between the voltages of BL/BLB and the targeted reference voltage during the equalization period.

23 Claims, 35 Drawing Sheets

Related U.S. Application Data

(60) Provisional application No. 63/210,466, filed on Jun. 14, 2021, provisional application No. 63/175,033, filed on Apr. 14, 2021, provisional application No. 62/777,727, filed on Dec. 10, 2018.

(51) Int. Cl.
  *G11C 11/408* (2006.01)
  *G11C 11/4091* (2006.01)
  *G11C 11/4094* (2006.01)

(58) Field of Classification Search
  USPC .................................................. 365/189.11
  See application file for complete search history.

(56) References Cited

U.S. PATENT DOCUMENTS

| | | | |
|---|---|---|---|
| 5,732,026 A | 3/1998 | Sugibayashi | |
| 5,808,930 A * | 9/1998 | Wada | G11C 5/14 365/51 |
| 5,978,255 A | 11/1999 | Naritake | |
| 5,986,914 A | 11/1999 | McClure | |
| 5,995,403 A | 11/1999 | Naritake | |
| 6,141,259 A | 10/2000 | Scott | |
| 6,272,054 B1 | 8/2001 | Barth | |
| 6,341,100 B1 | 1/2002 | Fujioka | |
| 6,344,990 B1 | 2/2002 | Matsumiya | |
| 6,636,454 B2 | 10/2003 | Fujino | |
| 8,559,220 B2 * | 10/2013 | Yamazaki | H01L 27/1203 365/72 |
| 2003/0133321 A1 * | 7/2003 | Jo | G11C 11/4091 365/149 |
| 2003/0174545 A1 * | 9/2003 | Wada | G11C 11/4091 365/204 |
| 2004/0243758 A1 | 12/2004 | Notani | |
| 2005/0247997 A1 | 11/2005 | Chung | |
| 2006/0114739 A1 | 6/2006 | Worley | |
| 2006/0221746 A1 | 10/2006 | Kang | |
| 2006/0233024 A1 * | 10/2006 | Matick | G11C 11/4085 365/230.01 |
| 2007/0085601 A1 | 4/2007 | Idei | |
| 2007/0187814 A1 | 8/2007 | Cusack | |
| 2007/0195624 A1 | 8/2007 | Song | |
| 2008/0159036 A1 | 7/2008 | Leung | |
| 2009/0231939 A1 | 9/2009 | Hsu | |
| 2009/0251975 A1 | 10/2009 | Chung | |
| 2010/0329051 A1 | 12/2010 | Demone | |
| 2014/0254241 A1 * | 9/2014 | Shiimoto | H10B 63/30 365/148 |
| 2016/0163364 A1 | 6/2016 | Lee | |
| 2016/0307616 A1 * | 10/2016 | Rim | G11C 29/028 |
| 2016/0372162 A1 | 12/2016 | Choi | |
| 2020/0185022 A1 | 6/2020 | Lu | |
| 2020/0185388 A1 | 6/2020 | Lu | |

FOREIGN PATENT DOCUMENTS

| | | |
|---|---|---|
| JP | 2010-186534 A | 8/2010 |
| KR | 10-2016-0148346 A | 12/2016 |

* cited by examiner

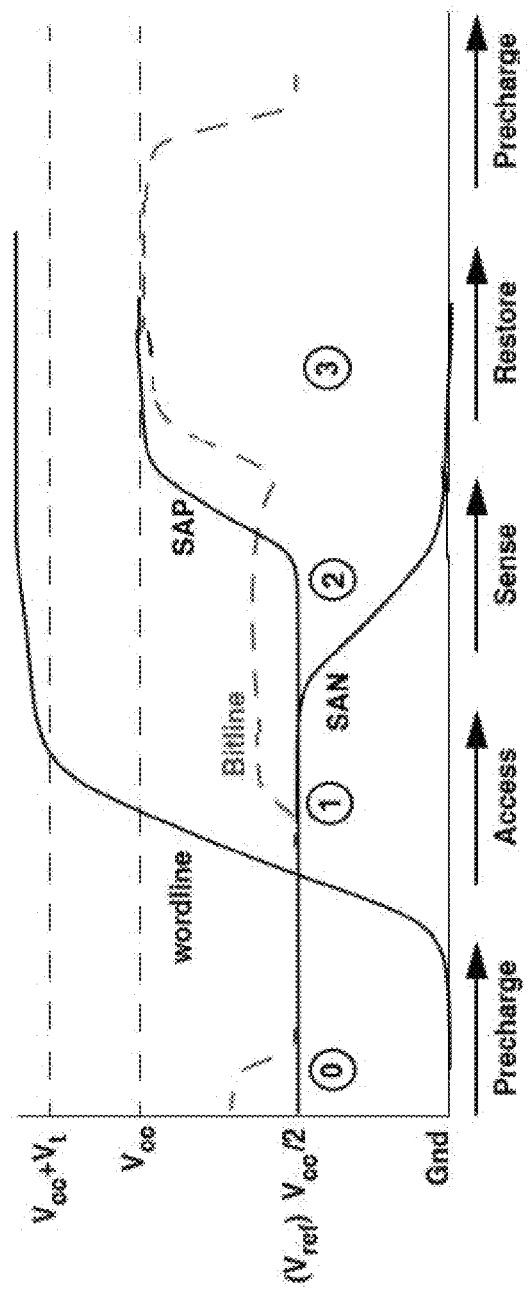

DYNAMIC MEMORY WITH SUSTAINABLE STORAGE ARCHITECTURE AND CLEAN UP CIRCUIT

CROSS REFERENCE TO RELATED APPLICATIONS

This application is a continuation-in-part of U.S. application Ser. No. 16/354,187, filed on Mar. 15, 2019, which claims the benefit of U.S. Provisional Application No. 62/777,727, filed on Dec. 10, 2018. Further, this application claims the benefit of U.S. Provisional Application No. 63/210,466, filed on Jun. 14, 2021, and also claims the benefit of U.S. Provisional Application No. 63/175,033, filed on Apr. 14, 2021. The contents of these applications are incorporated herein by reference.

BACKGROUND OF THE INVENTION

1. Field of the Invention

The present invention relates to dynamic memory, especially to dynamic memory with sustainable storage architecture and clean up circuit.

2. Description of the Prior Art

The most widely used DRAM cell has one access transistor which has its source connected to the storage capacitor and its drain connected to the bit-line. The bit-line is connected to the first-stage cross-coupled sense amplifier which transfer signals to be READ out from the cell-array through the column switches to a second-stage sense amplifier which is connected to the I/O lines (also known as Data lines). During WRITE operation the signals driven by I/O buffers to be stabilized on the Data lines which further stabilize the data over the first-stage sense amplifier to make the right signals written into the storage capacitor through the access transistor. The access transistor is responsible for READ operation or WRITE operation of the correct data into the storage capacitor during active mode (that is, the access transistor is ON) but also avoids the stored signal loss when the access transistor is during the inactive mode (that is, the access transistor is OFF).

The access transistor is designed to have a high threshold voltage to minimize the leakage current through the transistor. But the shortcoming result is that the access transistor loses its performance when it is turned ON. As a result, the word-line needs to be bootstrapped or connected to a high VPP (usually from a word-line voltage source) to allow the access transistor to have high drivability for WRITE of signals into the storage capacitor. Such a high VPP is passed through a word-line driver to be loaded onto the word-line or the gate of the access transistor. Since the VPP is a high voltage stress over the access transistor, the dielectric material of the transistor (for example, an oxide layer or a High-K material) must be designed to be thicker than that used for transistors used in other support circuits or peripheral circuits of DRAM (such as command decoder, address decoder, and other I/O circuits, etc.) Therefore, the design of the access transistor faces a challenge of maintaining either high performance or high reliability, and presents a difficult trade-off between reliability and performance. The widely used access transistor design is more focused on accomplishing high reliability but must sacrifice the performance of the access transistor.

In a brief summary, regarding the conventional access transistor design, it has a high threshold voltage to reduce the leakage current to help long retention time of retaining charges in the storage capacitor, a thick gate dielectric material to sustain the high word-line voltage like VPP, and sacrifices the performance of the access transistor. As a result, WRITE or READ of the signal ONE which is usually referred to a VCC level takes longer times or cannot completely restore the signal ONE. That is, the WRITE time is longer to satisfy the full-signal VCC to be completely written into the storage capacitor.

The conventionally designed of the DRAM cell could be illustrated in FIG. 1A. The DRAM cell includes an access transistor 11 and a storage capacitor 12. The gate of the access transistor 11 is coupled to a word-line (WL) and the cross-coupled sense amplifier 20 with four cross-connected transistors is coupled to the access transistor 11 through the bit-line (BL). The SAP (PMOS side of the sense amplifier) is the signal or voltage connected to two PMOS transistors in the sense amplifier 20, the SAN (NMOS side of the sense amplifier) is the signal or voltage connected to two NMOS transistors in the sense amplifier 20. When the switch transistor between the voltage source VCCSA and the SAP is turned on, the voltage value of SAP is almost equal to the value of the voltage source VCCSA (the voltage source coupled to the SAP) or Vcc which is usually corresponding to signal "1" stored in the DRAM cell. Similarly, when the switch transistor between the voltage source VSS and SAN is turned on, the voltage value of SAN is almost equal to the value of the voltage source VSS or Ground which is usually corresponding to signal "0" stored in the DRAM cell.

The DRAM cell uses the access transistor 11 as a switch to control the charges to be stored from the bit-line (BL) into the capacitor in WRITE mode or to be transferred out to bit-line in READ mode, where multiple DRAM cells are connected to the bit-line, respectively. In this example, there are signals ONE (supposed as 1.2 V, and the signal ONE is usually the level voltage of the voltage source VCCSA or Vcc provided from the cross-coupled sense amplifier 20) and ZERO (supposed as 0V, and the signal ZERO is usually the level voltage of the voltage source VSS or Ground provided from the cross-coupled sense amplifier 20) latched by a cross-coupled sense amplifier in READ mode by amplifying the signals transferred out by the cell signals on bit-lines, or these signals ONE and ZERO are written from the external to twist the sense amplifier for storing the right signals to the cells in WRITE mode.

FIG. 1B shows the related signal waveforms during access (READ or WRITE) operations of most current DRAMs. To give an example, a 25-nanometer DRAM cell has commonly the following parameters related to (surrounded with) the array design: the bit-line ONE voltage 1.2V, the word-line ON has the VPP up to 2.7V and the word-line OFF has the voltage about −0.3V, the threshold voltage of the cell is ranged around 0.7 to 0.9 V, the access transistor's dielectric must sustain the field strength under 2.7 V (under burn-in stress this number goes up to 3.4V for an acceptable reliability margin), and the Word-line driver device must also use the thick gate dielectric so that the performance must be sacrificed.

As shown in FIG. 1B, in the beginning, the storage capacitor of the DRAM is in the standby or inactive mode (that is, the access transistor is OFF), the voltage level of the word-line coupled to the gate of the access transistor is a standby negative voltage (−0.3V). The bit-line and bit-line bar are equalized (by a voltage equalization circuit which will be illustrated later) at a voltage level of half-VCCSA between the ONE level at VCCSA=1.2V and the ZERO level of 0 V.

When the storage capacitor enters the active mode (that is, the access transistor is ON) to begin the access operation, the voltage level of the word-line is raised from a standby negative voltage (−0.3V) and pulled up to a high level VPP (such as 2.7 V) which is much higher than the VCCSA (1.2 V) plus the threshold voltage Vt of the access transistor (could be 0.7 or 0.8V) to provide sufficiently large drive over the access transistor's Gate-to-Source voltage (e.g. 2.7 V−1.2 V−0.8 V=0.7 V). The bit-line is coupled to the storage capacitor for charge sharing. The word-line is continuously ON at such a high voltage VPP for access operation (such as READ or WRITE) and the cross-coupled sense amplifier amplifies the voltage difference between bit-lines (BL and BLB).

Furthermore, a RESTORE phase is proceeded following the access operation. During the RESTORE phase, the cross-coupled sense amplifier will recharge the storage capacitor based on the signal ONE or ZERO in the storage capacitor. After the RESTORE phase, the word-line is pulled down from VPP to the voltage of word-line at standby mode (−0.3 V) and the access transistor is in the inactive mode.

For detailed explanation the operation of the aforesaid conventional DRAM circuit, hereinafter an access-read operation for a corresponding DRAM cell which stores signal "1" is used as an example, and the following is cited from. Bruce Jacob, et al., "Memory Systems-Cache Dram and Disk", published by Elsevier Inc. on 2008, pages 362-365. The content of which is incorporated by reference herein. Please refer to FIG. 1C which shows the conventional circuit of DRAM cells with a sense amplifier circuit (or sensing circuit) 20 and a voltage equalization circuit 21. The voltage equalization circuit 21 is to ensure that the voltages on the bitline pairs are as closely matched as possible. As previously mentioned, the sense amplifier circuit 20 includes four cross-connected transistors (that is, two P type transistors ("PFets") and two N type transistors ("NFets")). The sensing amplifier circuit 20 drives the bitline pairs to complementary voltage extremes, depending on the respective voltages on the bitlines at the time the SAN and SAP signals are activated (that is, the SAN and SAP signals are connected to VSS and VCCSA respectively, as shown in FIG. 1A). After the assertion of the SAN and SAP signals or voltages, the bitline is driven to the full voltage level. The column-select line (CSL) then turns on the output transistors and allows the fully driven voltage to reach the output and be read out of the DRAM device. At the same time, the access transistor 11 for the accessed DRAM cell remains open, and the fully driven voltage on the bitline now recharges the storage capacitor 12.

Based on an access-read operation to the conventional DRAM cells, FIGS. 1D-1G shows four different phases regarding operations of the sense amplifier, including precharge, access, sense, and restore phases. First of all, as shown in FIG. 1D, during the precharge phase, the bitlines in a DRAM array are precharged to a reference voltage, Vref (which is usually Vcc/2, that is, the voltage halfway between the power supply voltage Vcc and ground), is used as the reference voltage. At this precharge phase, the voltage equalization circuit 21 is activated to place the reference voltage Vref for the bitlines pair, that is, both the bitline ("BL") and the bitline ("BLB" or "complementary bit line") are precharged to Vref. In this recharge phase, the sense amplifier circuit 20 is inactive.

Then, during the access phase in which the voltage equalization circuit 21 is inactive, as shown in FIG. 1E, a voltage (such as Vcc+Vt or VPP shown in FIG. 1B) is applied to a wordline corresponding to the selected DRAM cell. The voltage on the wordline activates or turns on the access transistor 11 of the selected DRAM cell, and the storage capacitor 12 of the selected DRAM cell then discharges its content onto the respective bitline through the charge sharing process. In this case, the voltage in the storage capacitor 12 represents a digital value of "1" in FIG. 1E, thus the charge sharing process minutely increases the voltage on the bitline from Vref to Vref+. Then, as the voltage on the bitline changes, the voltage on the bitline begins to affect operations of the sense amplifier circuit 20. The slightly higher voltage on the bitline begins to drive the lower NFet to be more conductive than the upper NFet of the sense amplifier circuit 20. Conversely, the minute voltage difference also drives the lower PFet of the sense amplifier circuit 20 to be less conductive than the upper PFet. The bitline voltage thus biases the sense amplifier circuit 20 for the following sensing phase.

Afterward, during the sense phase in which the voltage equalization circuit 21 is still inactive, as shown in FIG. 1F, the previously-mentioned minute voltage differential drives a bias into the sense amplifier circuit 20, the SAN signal drives the voltage on the lower bitline down. As the SAN signal turns on (that is, connected to VSS or Ground as shown in FIG. 1A), the more conductive lower NFet allows the SAN signal to drive the lower bitline down in voltage from Vref to ground. Similarly, the SAP signal (which is connected to VCCSA or Vcc as shown in FIG. 1A) drives the bitline to a fully restored voltage value that represents the digital value of "1" which corresponding to VCCSA or Vcc. The SAN and SAP signals thus collectively force the bi-stable sense amplifier circuit to be driven to the respective maximum or minimum voltage rails.

Finally, as shown in FIG. 1G regarding the restore phase, after the bitline and the bitline are driven to the respective maximum (VCCSA or Vcc) and minimum (VSS or Ground) voltage values, the overdriven wordline remains active, and the fully driven bitline voltage now restores the charge in the storage capacitor 12 through the access transistor 11. It is noticed that, during the restore phase, the conventional DRAM utilizes the voltage VCCSA or Vcc which is corresponding to signal "1" as shown in FIG. 1G to restores the charge to the storage capacitor 12, thus the voltage stored in the storage capacitor 12 would be the same or substantially the same as the voltage corresponding to signal "1" as shown in FIG. 1G.

FIG. 1H shows the voltage waveforms for the bitline and selected control signals illustrated in FIGS. 1D-1G. Before an access operation, the bitline is precharged, and the voltage on the bitline is set to the reference voltage, Vref. In phase one or access phase, the wordline voltage is overdriven to at least Vt above Vcc, and the DRAM cell discharges the content of the storage capacitor 12 onto the bitline and raises the voltage from Vref to Vref+. In phase two or sense phase, the sense control signals SAN and SAP drive the voltage on the bitline to the full voltage Vcc which represents the signal "1". The voltage Vcc corresponding to signal "1" on the bitline then restores the charge in the DRAM cells in phase three or restore phase.

Thus, based on the aforesaid description regarding FIGS. 1C-1H, the voltage of the bitline (marked by the dash line in FIG. 1H) is set to Vref (or Vcc/2) by the voltage equalization circuit 21 during the precharge phase. Then after the wordline turns on the access transistor 11, the charge sharing process raises the voltage of the bitline from Vref to Vref+ during the access phase. Afterward, during the sense phase, the voltage of the bitline is raised from Vref+ close to VCCSA (or Vcc) by the help of the SAP signal which is connected to the voltage source VCCSA (or Vcc) as shown in FIG. 1A. Finally, during the restore phase, the sense circuit 20 still activates and the voltage source VCCSA (or Vcc) which is corresponding to signal "1" is coupled to the bitline through the sense circuit 20 for restoring the charge into the storage capacitor 12. Thus, from the access phase, the sense phase, to the restore phase, there is a high voltage source VCCSA (or Vcc) coupled to the sense circuit 20 through SAP, and a low voltage source VSS (or Ground) coupled to the sense circuit 20 through SAN. No other voltage sources are coupled to the sense circuit 20 from the access phase to the restore phase in the conventional DRAM circuit.

However, this high VPP voltage on the wordline stress causes the access transistor to be designed with a thicker gate-oxide or gate-insulator than that used for the transistors in peripheral circuits, which degrades the access transistor performances such as the worse short-channel effects, the ON-OFF ratio of the transistor currents, and the swing slopes, etc. Moreover, although the threshold voltage is designed to be higher than that used in the transistors of peripheral circuits, the leakage current through the access transistor during the standby mode or inactive mode is still high to degrade the amount of stored charges for sensing. When the VCCSA is lower (such as 0.6V) in 12 nm or 7 nm FinFET process, the leakage problem in the standby mode or inactive mode will be worse.

SUMMARY OF THE INVENTION

Therefore, the present invention is to introduce DRAM with sustainable storage architecture and cleanup circuit. According to an aspect of the invention, the DRAM comprises a first sustaining voltage generator producing a first voltage level which is higher than a voltage level of a signal ONE utilized in the DRAM chip, a DRAM cell which includes an access transistor and a storage capacitor, a sense amplifier, an equalization circuit, and a clean up circuit. The sense amplifier is coupled to a bit line and a complementary bit line, wherein the bit line is coupled to the storage capacitor through the access transistor. The equalization circuit is also coupled to the bit line and the complementary bit line, wherein the equalization circuit couples the bit line and the complementary bit line to a preset reference voltage during an equalization period. The clean up circuit is coupled to the sense amplifier or the equalization circuit. Wherein the first sustaining voltage generator is electrically coupled to the storage capacitor of the DRAM cell during a turning-off period of the access transistor of the DRAM cell, and the clean up circuit is activated to mitigate a difference between a voltage of the bit line and a targeted reference voltage during the equalization period.

According to another object of the invention, the DRAM further comprises a word line coupled to a gate terminal of the access transistor, wherein the word-line is selected to turn on the access transistor for a first period and a second period which is after the first period, and the first sustaining voltage generator is electrically coupled to the bit line during the second period.

According to one aspect of the invention, the first sustaining voltage generator is electrically coupled to the sense amplifier during the second period, and the first sustaining voltage generator is electrically coupled to the storage capacitor of the DRAM cell through the sense amplifier and the bit line.

According to one aspect of the invention, the first period is an access operation period, and the second period is a restore phase period. Moreover, in another aspect, a kicking charge source is electrically coupled to a bit line of the DRAM chip during the access operation period. The signal of the bit line is raised to a kick voltage level by the kicking charge source during the access operation period, the kick voltage level is lower than the first voltage level but higher than the voltage level corresponding to the signal ONE.

According to one aspect of the invention, the first period comprises a first kick period and a second kick period separate from the first kick period, a kicking charge source is coupled to the bit line during the first kick period, or coupled to the bit line during the first kick period and the second kick period.

According to one aspect of the invention, the word-line is selected to turn on the access transistor for the first period and the second period according to a refresh operation. A kicking charge source is electrically coupled to the bit line for a kick period which is prior to the first period, and the first sustaining voltage generator is electrically coupled to the bit line for all the second period According to one aspect of the invention, wherein the second period is at least 20% of the sum of the kick period, the first period and the second period. In another example, the second period is at least 50% of the sum of the kick period, the first period and the second period.

According to one aspect of the invention, the equalization period is after the turning-off period of the access transistor, and the clean up circuit is activated during equalization period such that the voltage of the bit line is equal to the preset reference voltage after the equalization period. Moreover, the cleanup circuit is activated by a clean up pulse, and a width of the clean up pulse is not greater than that of the equalization period.

According to one aspect of the invention, the cleanup circuit is activated by a clean up pulse, and a rising edge of the clean up pulse is substantially aligned with a rising edge of the equalization period.

According to one aspect of the invention, the cleanup circuit comprising a switch circuit coupled to the sense amplifier and a predetermined voltage. In another example, the clean up circuit comprising a switch circuit coupled to the equalization circuit and a predetermined voltage.

Another object of the invention is to provide a DRAM chip with clean up circuit. The DRAM chip comprises a DRAM cell which includes an access transistor and a storage capacitor, a sense amplifier, an equalization circuit, and a clean up circuit. The sense amplifier is coupled to a bit line and a complementary bit line, wherein the bit line is coupled to the storage capacitor through the access transistor. The equalization circuit is also coupled to the bit line and the complementary bit line, wherein the equalization circuit couples the bit line and the complementary bit line to a preset reference voltage during an equalization period. The cleanup circuit is coupled to the sense amplifier or the equalization circuit. Wherein the clean up circuit is activated to mitigate a difference between a voltage of the bit line and a targeted reference voltage during the equalization period.

According to one aspect of the invention, the voltage of the bit line is equal to the preset reference voltage after the equalization period.

According to another aspect of the invention, the clean up circuit is electrically coupled to the bit line and the complementary bit line during the equalization period through the sense amplifier or the equalization circuit.

According to another aspect of the invention, the clean up circuit comprising a switch circuit coupled to the sense amplifier and a predetermined voltage. In another example, the cleanup circuit comprising a switch circuit coupled to the equalization circuit and a predetermined voltage.

According to an aspect of the invention, the clean up circuit is activated by a clean up pulse during the equalization period, and a rising edge of the clean up pulse is substantially aligned with a rising edge of the equalization period.

According to an aspect of the invention, the DRAM chip further comprises a comparator circuit receiving the voltage of the bit line, the voltage of the complementary bit line and the preset reference voltage at the beginning of or during the equalization period, and sends a control signal to the clean up circuit in the event one half of a sum of the voltage of the bit line and the voltage of the complementary bit line is not equal to preset reference voltage.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1H illustrates the voltage waveforms for the bitline and selected control signals illustrated in FIGS. 1D-1G.

DETAILED DESCRIPTION

A detailed description of the hereinafter described embodiments of the disclosed apparatus and method are presented herein by way of exemplification and not limitation with reference to the figures. Although certain embodiments are shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of embodiments of the present invention.

This invention is to disclose DRAM with sustainable storage architecture, in which a sustaining voltage source is electrically coupled to the storage capacitor of the DRAM cell before the turn off of the access transistor, and the voltage level of the sustaining voltage source is higher than that of the regular signal ONE; or the voltage level of the sustaining voltage source is lower than that of the regular signal ZERO. DRAM operations (such as auto-precharge operation, RESTORE phase, refresh phase, and precharge phase) will make the selected DRAM cell to turn on the access transistor thereof. Thus, by coupling the aforesaid sustaining voltage source to the storage capacitor of the DRAM cell during the turn on stage of the access transistor, the storage capacitor can sustain for a longer period compared with conventional DRAM structure after the turn off stage of the access transistor, even if there is leakage current through the access transistor.

Example 1

Figure 2:
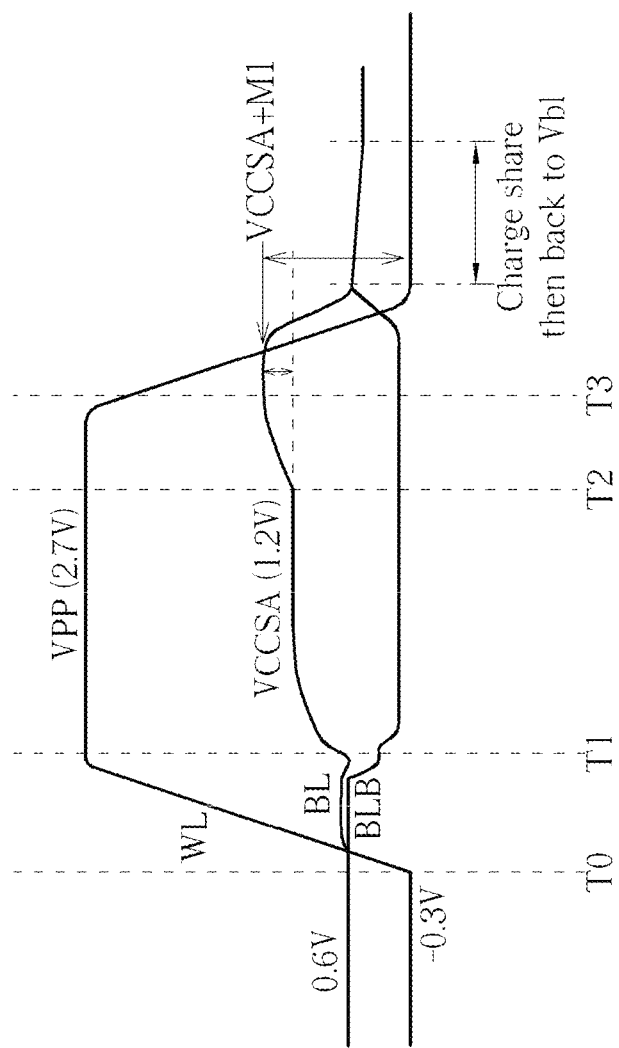
FIG. 2 illustrates the related signal waveforms during access (READ or WRITE) operation of the DRAM cell according to one embodiment of this invention.

FIG. 2 illustrates the related signal waveforms for access (READ or WRITE) operation of the DRAM cell according to one embodiment of this invention. By starting from the standby mode of the DRAM, the word-line WL is biased at −0.3 V in order to fully turn off the access transistor 11. In this embodiment, the VCCSA is set to 1.2V and VSS is set to 0V. The level of signal ONE is 1.2V and the level of signal ZERO is 0 V (GND) in this example. The bit-lines (BL and BLB) are equalized at a voltage level of 0.6V between the signal ONE level at VCCSA=1.2V and the signal ZERO level at VSS=0V.

At T0, the word-line voltage is ramping up from −0.3 V to 2.7 V which is much higher than the VCCSSA of 1.2 V and the access transistor's threshold voltage of 0.8 V to give enough driving for the turned-on access transistor 11 to transfer either the signal ONE or ZERO to the bit-lines. Until the signal is developed to a certain magnitude during the access phase mentioned in FIG. 1E, the sense amplifier 20 is activated to amplify the signal across the bit-line (BL) and bit-line bar (BLB). After T1 during the sense phase mentioned in FIG. 1F, either READ operation (by amplifying the signals transferred out by the cell signals on bit-lines) or WRITE operation (these signals ONE and ZERO are written from the external to twist the sense amplifier 20 for storing the right signals to the DRAM cell) can be performed. Of course, besides READ or WRITE, other DRAM operations may be performed after T1. That is, the DRAM cell is accessible during the period between T1 and T2.

After T2 during the RESTORE phase, the dielectric of the access transistor 11 is still loaded by VPP from word-line (WL) for a reasonably short time of restore. A first sustaining voltage source is intentionally coupled to the capacitor of the DRAM cell during this RESTORE phase. The voltage level of the first sustaining voltage source is higher than VCCSA of 1.2V (or the voltage level of signal ONE). This could be done by connecting or coupling the first sustaining voltage source (VCCSA+M1) to the sense amplifier 20 (such as, by turning on the switch 13), as shown in FIG. 3A which illustrates a schematic circuit of the sense amplifier 20 selectively coupled to the first sustaining voltage source.

Figure 3A:
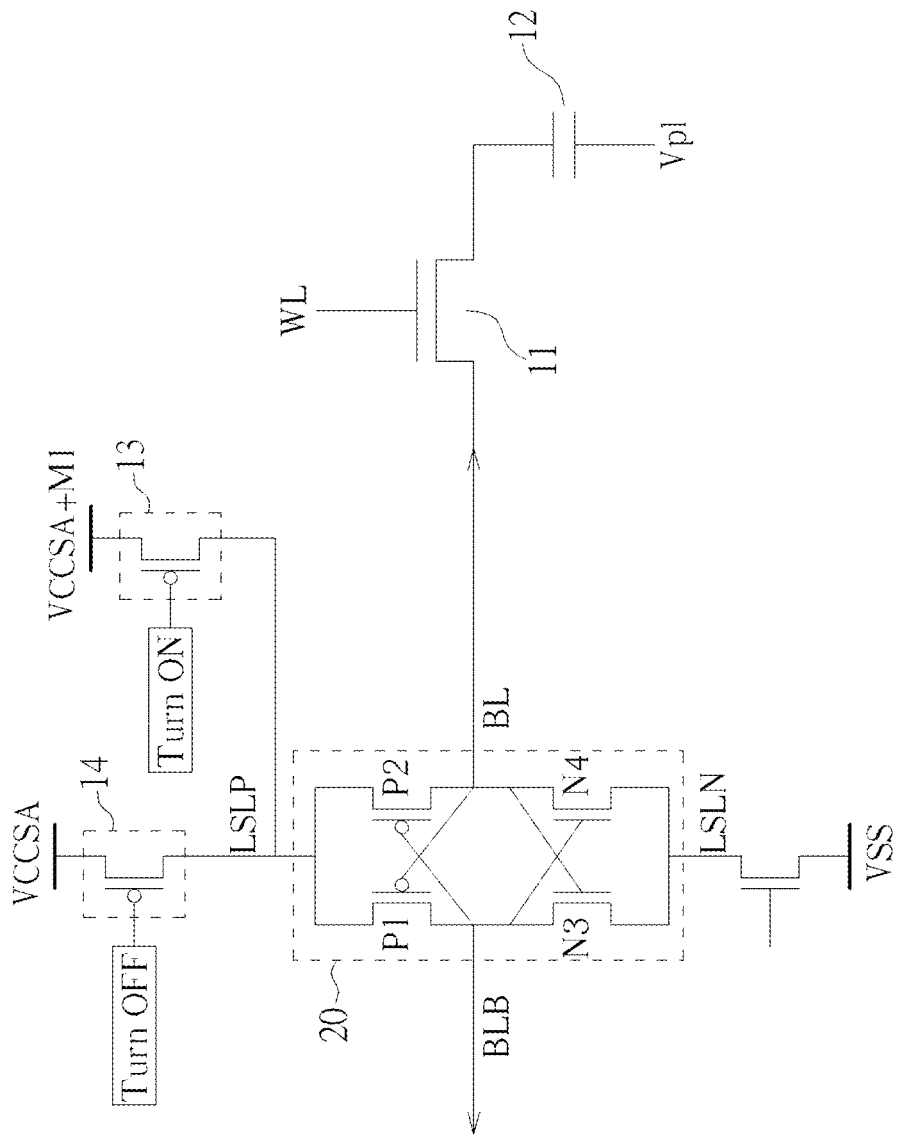
FIG. 3A shows a schematic circuit for the sense amplifier selectively coupled to a first sustaining voltage source which is higher than VCCSA.

During this RESTORE phase, the original VCCSA voltage source is disconnected from the sense amplifier (such as, by turning off the switch 14), and the first sustaining voltage source (VCCSA+M1) will be connected to the sense amplifier 20, as shown in FIG. 3A. M1 could be a positive number such that the first sustaining voltage source (VCCSA+M1) is higher than VCCSA. In one example, M1 could be in the range of ⅓ VCCSA to ⅔ VCCSA, such as 0.6V. For example, when the signal ONE is originally in the storage capacitor, during this RESTORE phase, a voltage level of 1.2V+0.6V from the first sustaining voltage source is then supplied to the storage capacitor 12 through the sense amplifier 20. That is, before the turnoff of the access transistor 11 at T3 (that is, the word-line WL is pulled down from VPP of 2.7V to the voltage of word-line at standby mode of −0.3V) in FIG. 2, the storage capacitor 12 is supplied with the voltage level of the first sustaining voltage source which is higher than that of the regular signal ONE (VCCSA). Thus, after the turn off of the access transistor 11, the storage capacitor 12 can sustain for a longer period compared with conventional DRAM structure even there is leakage current through the access transistor 11. In one embodiment, after the turn off of the access transistor 11 or after the RESTORE phase, the first sustaining voltage source (VCCSA+M1) could be disconnected from the sense amplifier 20. Additionally, the bit-line (BL) could be coupled to a bit-line voltage source with a voltage level of Vb1, such that the voltage level of the bit-line (BL) will be reset to Vb1, as shown in FIG. 2.

Figure 3B:
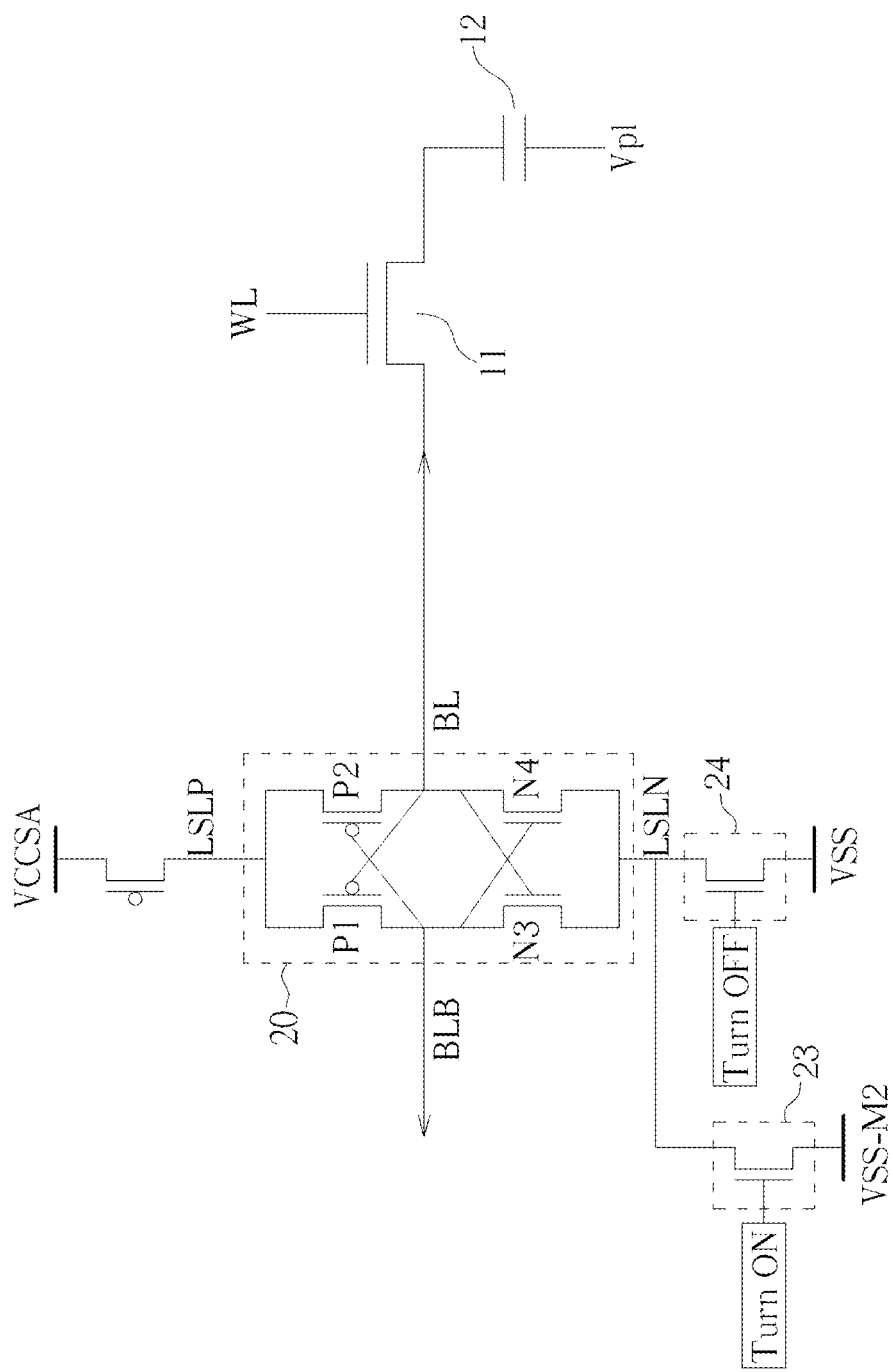
FIG. 3B shows a schematic circuit for the sense amplifier selectively coupled to a second sustaining voltage source which is lower than VSS.

In another embodiment, after T2 during the RESTORE phase, a second sustaining voltage source is intentionally coupled to the capacitor of the DRAM cell during RESTORE phase. The voltage level of the second sustaining voltage source is lower than voltage source VSS (0V or the voltage level of signal ZERO). This could be done by connecting the second sustaining voltage source (VSS−M2) to the sense amplifier (such as, by turning on the switch 23), as shown in FIG. 3B. FIG. 3B illustrates a schematic circuit of the sense amplifier selectively coupled to a second sustaining voltage source (VSS−M2) which is lower than VSS, wherein M2 could be a positive number. In one example, M2 could be in the range of 0.4V–0.8V, such as 0.6V. Of course, when the second sustaining voltage source is coupled to the sense amplifier 20 during the RESTORE phase, the voltage source VSS is disconnected from the sense amplifier 20 (such as, by turning off the switch 24). When the signal ZERO is originally in the storage capacitor 12, during this RESTORE phase, a voltage level of −0.6V is then supplied to the storage capacitor. That is, before the turn off of the access transistor 11 at T3 (that is, the word-line WL is pulled down from VPP to the voltage of word-line at standby mode) in FIG. 2, the storage capacitor 12 is supplied with the voltage level of the second sustaining voltage source which is lower than that of the regular signal ZERO (VSS). In one embodiment, after the turn off of the access transistor 11 or after the RESTORE phase, the second sustaining voltage source (VSS−M2) could be disconnected from the sense amplifier 20.

Of course, in another embodiment, both the first and the second sustaining voltage sources could be intentionally coupled to the capacitor of the DRAM cell during RESTORE phase. Therefore, before the word-line WL is pulled down from VPP to the voltage of word-line at standby mode, when the signal ONE is originally in the storage capacitor, a voltage level of 1.2V+0.6V is then stored in the storage capacitor; or when the signal ZERO is originally in the storage capacitor, a voltage level of −0.6V is then stored in the storage capacitor.

Example 2

In order to reduce the leakage current to maintain the stored charges without being leaked through the access transistor, usually designs are made to let the access transistor have a very high threshold voltage. When the VCCSA is reduced to 0.6 V, the 7 nm or 5 nm process tri-gate or FinFET transistors are adopted for peripheral circuits in DRAM design, and the threshold voltage of these transistor can be scaled accordingly, such as to be reduced to 0.3 V. In this embodiment, the threshold voltage of the access transistor could be raised up to 0.5 to 0.6 V on purpose. So the leakage current from the storage capacitor is sharply reduced by at least 3-4 decades (=0.6-0.3-0.3 V, if the S-factor is 68 mV/decade, the leakage can be reduced 4 decades than that of the peripheral Tri-gate devices; if the threshold voltage is raised to 0.5 V, then the leakage current should be 2-3 decades). Raising the threshold voltage close to the VCCSA or at least more than 80% of the 0.6 V is proposed. In the embodiment, the gate-dielectric thickness of the access transistor (such as finfet or tri-gate transistor) is still maintained as that of the peripheral transistors without increasing its thickness, and then the high performance merit of using the tri-gate structure can be maintained.

Figure 4:
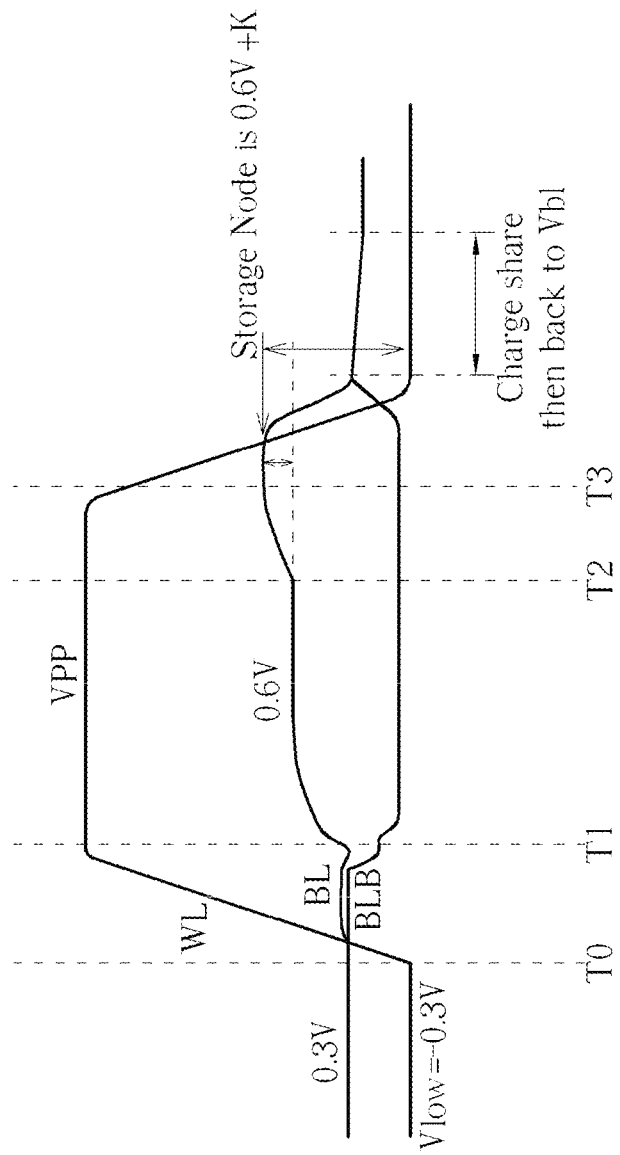
FIG. 4 illustrates the related signal waveforms of the DRAM cell according to another embodiment of this invention.

FIG. 4 illustrates the related signal waveforms of the DRAM cell according to another embodiment of this invention. The level of signal ONE is 0.6V and the level of signal ZERO is 0 V (GND) in this example. After T2 during the RESTORE phase, a first sustaining voltage source is intentionally coupled to the capacitor of the DRAM cell during RESTORE phase. The voltage level of the first sustaining voltage source is higher than VCCSA of 0.6V (or the voltage level of signal ONE). This could be done by connecting the first sustaining voltage source (VCCSA+K) to the sense amplifier, wherein K could be a positive number. In one example, K could be in the range of ⅓ VCCSA to ⅔ VCCSA, such as 0.3 V or 0.4 V. Therefore, when the signal ONE of 0.6V is originally in the storage capacitor, during this RESTORE phase, a voltage level of 0.6V+0.4V is then supplied to the storage capacitor. That is, before the turn off of the access transistor at T3 (that is, the word-line WL is pulled down from VPP to the voltage of word-line at standby mode) in FIG. 4, the storage capacitor is supplied with the voltage level of the first sustaining voltage source which is higher than that of the regular signal ONE (VCCSA of 0.6V). Therefore, after the word-line WL is pulled up to VPP but before the word-line is pulled down to the standby or inactive mode, a voltage level of 1V is then stored in the storage capacitor when the signal ONE is originally in the storage capacitor. In one embodiment, after the RESTORE phase, the bit-line (BL) and bit-line bar (BLB) could be coupled to a bit-line voltage source with a voltage level of Vb1, such that the voltage level of the bit-line (BL) and the voltage level of bit-line bar (BLB) will be reset to Vb1, as shown in FIG. 4.

Of course, as previously mentioned, before the word-line WL is pulled down from VPP to the voltage of word-line at standby mode, when the signal ZERO is originally in the storage capacitor, a voltage level of the second sustaining voltage source could be then stored in the storage capacitor, wherein the voltage level of the second sustaining voltage source is lower than the signal ZERO, such as −0.4V.

Example 3

Figure 5:
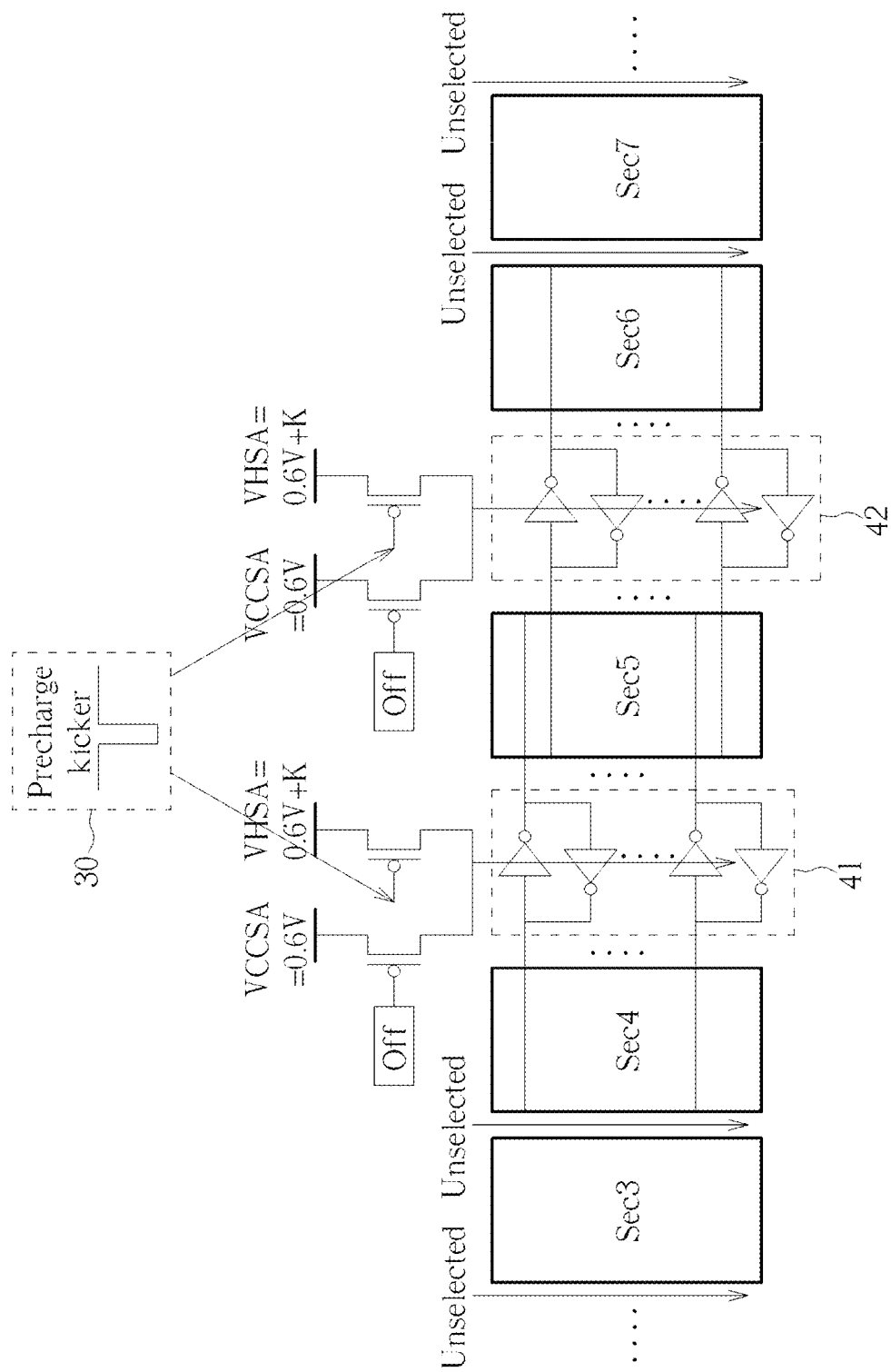
FIG. 5 shows the functional block diagrams of one embodiment of this invention regarding precharge operation.

FIG. 5 shows another embodiment regarding the circuit and functional block diagrams for precharge operation. In this embodiment, the VCCSA is set to 0.6V and VSS is set to 0V. In the precharge operation, all the DRAM cells connected to the selected word line(s) in memory section 5 ("Sec 5") will be precharged, and those DRAM cells connected to unselected word lines in other memory sections (such as "Sec4", "Sec6", etc.) will be at idle state.

The sense amplifiers 41 and 42 coupled to the DRAM cells which are connected to the selected word line(s) will be kicked to a third sustaining voltage source VHSA (0.6V+K) by the precharge kicker 30, so that a stronger drain-to-source electrical field can accelerate the signal restored to the cell. The third sustaining voltage source VHSA is higher than the VCCSA (0.6V) about few hundred mV, for example 0.3V or 0.4V. Moreover, before the selected word line(s) is OFF (that is, the access transistors of DRAM cells coupled to the selected word line(s) are OFF), the voltage level of 0.6V+ 0.4V which is higher than that of the original signal ONE could be then stored in the storage capacitors. On the other hand, the sense amplifiers coupled to the DRAM cells which are connected to the unselected word line(s) will not be kicked up and are still coupled to VCCSA.

Figure 6:
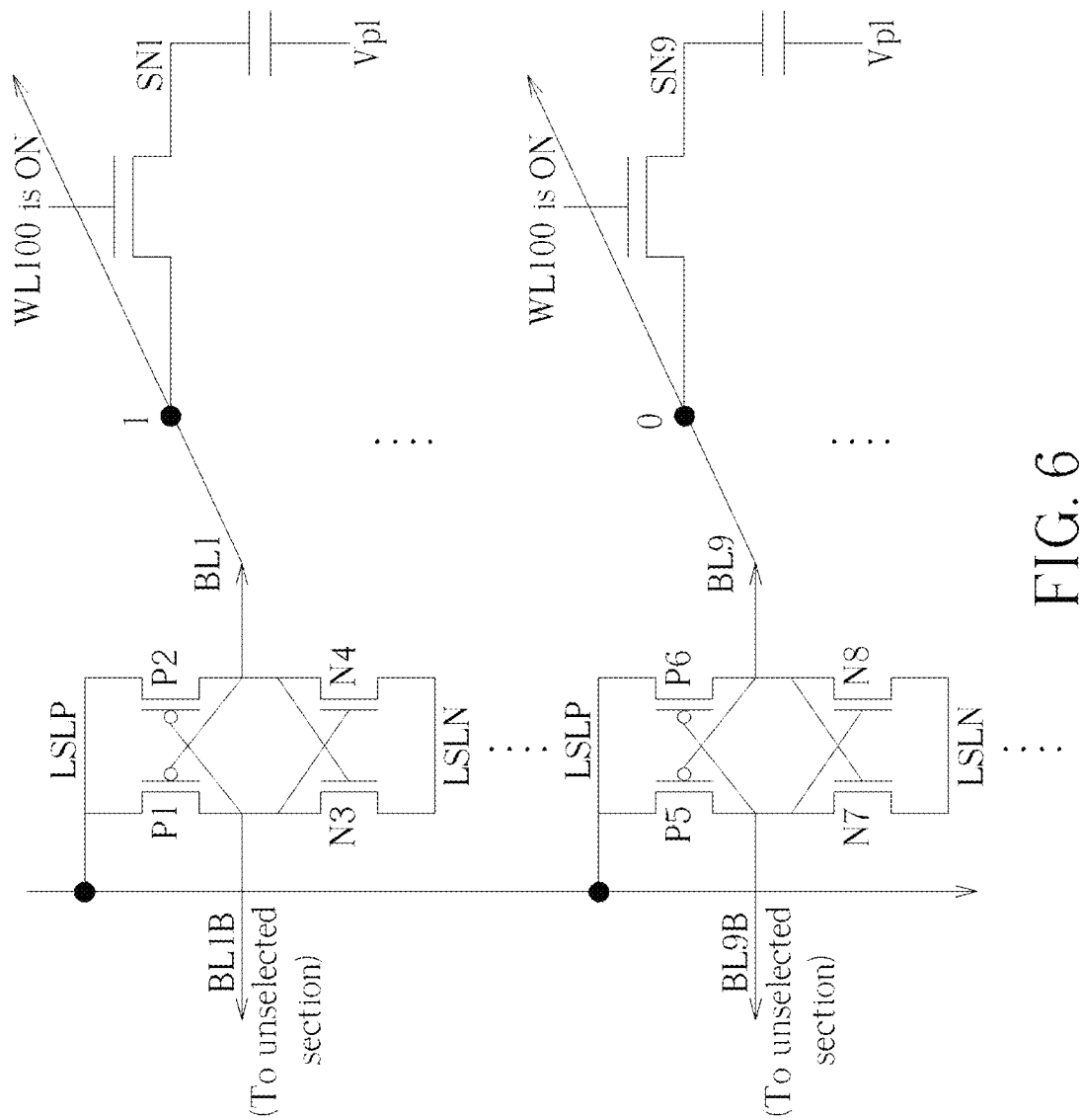
FIG. 6 illustrates the operation of the sense amplifiers for the precharge operation according to this invention.

FIG. 6 explains the operation of the sense amplifiers for the precharge phase, and the meaning for the symbols used in FIG. 6 is as follows:
VCCSA: Bit Line Sense Amplifiers Voltage
VHSA: the third sustaining voltage source
LSLP: Selected Bit Line Sense Amplifiers High Voltage
LSLN: Selected Bit Line Sense Amplifiers Low Voltage
Vpl: Plate Voltage
SN: Storage Node
WL: Word Line
BL: Bit Line
Vsg1,2: Source to Gate Voltage of P1,P2
Vgs3,4: Gate to Source Voltage of N3,N4
Vsg5,6: Source to Gate Voltage of P5,P6
Vgs7,8: Gate to Source Voltage of N7,N8

Referring to FIG. 6, the word-line WL100 is coupled to multiple storage nodes, such as SN1 and SN9. When the signal ONE (0.6V) is stored in the storage node SN1 which is connected to word-line WL100, after the precharge command is issued and the word-line WL100 is selected (that is, the word-line is ON), the LSLP of the sense amplifier is coupled to the VHSA (1.0V), therefore LSLP is kicked from 0.6V to 1.0V, and LSLN stays in 0V. Thus, transistor P1 of the sense amplifier is OFF and Vsg1=0V. Also, transistor P2 of the sense amplifier is ON and Vsg2 is kicked from 0.6V to 1.0V, and 1.0V is fully charged through bit-line BL1 to storage node SN1. Meanwhile, transistor N3 of the sense amplifier is ON and the Vgs3 is also kicked from 0.6V to 1.0V. Furthermore, transistor N4 of the sense amplifier is OFF and the Vgs4 is 0V.

When the signal ZERO (0V) is stored in the storage node SN9 which is connected to the word-line WL100, after the precharge command is issued and the word-line WL100 is selected, the sense amplifier is coupled to the VHSA (1.0V), therefore LSLP is kicked from 0.6V to 1.0V, and LSLN stays in 0V. Thus, transistor P5 of the sense amplifier is ON and Vsg5 is kicked from 0.6V to 1.0V. Also, transistor P6 of the sense amplifier is OFF and Vsg2 is 0V. Meanwhile, transistor N7 of the sense amplifier is OFF and the Vgs7 is 0V.

Furthermore, transistor N8 of the sense amplifier is ON and the Vgs8 is kicked from 0.6V to 1.0V, and 0V is restored strongly through bit-line BL9 to storage node SN9. Of course, as previously mentioned, when the signal ZERO is originally in the storage capacitor, LSLN could be coupled to another sustaining voltage source VLSN (0V-K) during the precharge phase. VLSN is lower than the voltage level of the signal ZERO, and in this case, VLSN could be −0.4V. Then −0.4V is restored strongly through bit-line BL9 to storage node SN9 during the precharge phase.

In another embodiment, coupling the first sustaining voltage source which is higher than the voltage level of signal ONE to the sense amplifier (or DRAM storage cell) could be applied to the refresh operation or other operation (such as READ/WRITE with auto precharge operation), as long as the first sustaining voltage source is coupled to the sense amplifier (or DRAM storage cell) before the word-line coupled to the DRAM storage cell is OFF. Also coupling the second sustaining voltage source which is lower than the voltage level of signal ZERO to the sense amplifier (or DRAM storage cell) could be applied to the refresh operation or other operation, as long as the second sustaining voltage source is coupled to the sense amplifier (or DRAM storage cell) before the word-line coupled to the DRAM storage cell is OFF.

Example 4

Figure 7:
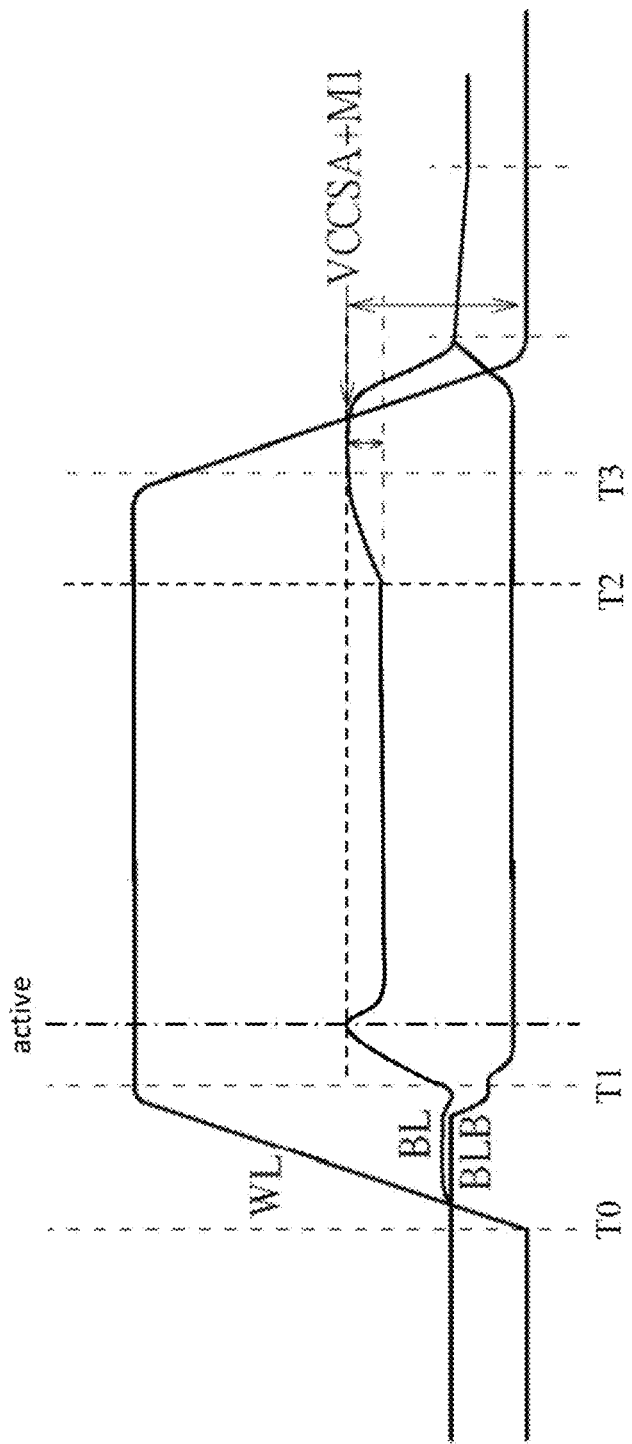
FIG. 7 illustrates the related signal waveforms during the operation of the DRAM cell according to another embodiment of this invention.

FIG. 7 illustrates the related signal waveforms for the operation of the DRAM cell according to another embodiment of this invention. At beginning, the word-line WL is biased in order to fully turn off the access transistor of the DRAM cell. In this embodiment, the VCCSA is set to 1.1V and VSS is set to 0V. The level of signal ONE is 1.1V and the level of signal ZERO is 0 V (GND) in this example. The bit-line (BL) and bit-line bar (BLB) are equalized between the signal ONE level at VCCSA=1.1V and the signal ZERO level at VSS=0V. After T0, the word-line voltage is ramping up in order to turn on the access transistor of the DRRAM cell. During the period between T1 and T2, there is an active command to be performed and a corresponding first sustaining voltage source (VCCSA+M1) could be connected to the sense amplifier (by turning off the switch 14 and turning on the switch 13 as shown in FIG. 3A) during the active command. Therefore, the signal of the bit-line would be pumped (or kicked) at least to VCCSA+M1 during the active command. After the performance of the active command, a regular voltage source VCCSA is connected to the sense amplifier (by turning off the switch 13 and turn on the switch 14, as shown in FIG. 3A) and then the signal of the bit-line would be back to VCCSA. Such kick for the bit-line would expedite the signal sensing.

Similarly, after T2 during the RESTORE (or precharge) phase, the first sustaining voltage source VCCSA+M1 (or a different sustaining voltage which is higher than VCCSA) is intentionally coupled to the capacitor of the DRAM cell during this RESTORE phase. That is, during this RESTORE (or precharge) phase, the original VCCSA voltage source is disconnected from the sense amplifier (such as, by turning off the switch 14 as shown in FIG. 3A), and the first sustaining voltage source VCCSA+M1 will be connected to the sense amplifier 20 (such as, by turning on the switch 13 as shown in FIG. 3A). The signal of the bit-line would be pumped (or kicked) at least to VCCSA+M1. Thus, before the word-line WL is pulled down to fully turnoff the access transistor of the DRAM cell, the storage capacitor of the DRAM cell is supplied with the voltage level of the first sustaining voltage source which is higher than that of the regular signal ONE (VCCSA), and the storage capacitor of the DRAM cell can sustain fora longer period compared with conventional DRAM structure even there is leakage current through the access transistor.

Example 5

Figure 8A:
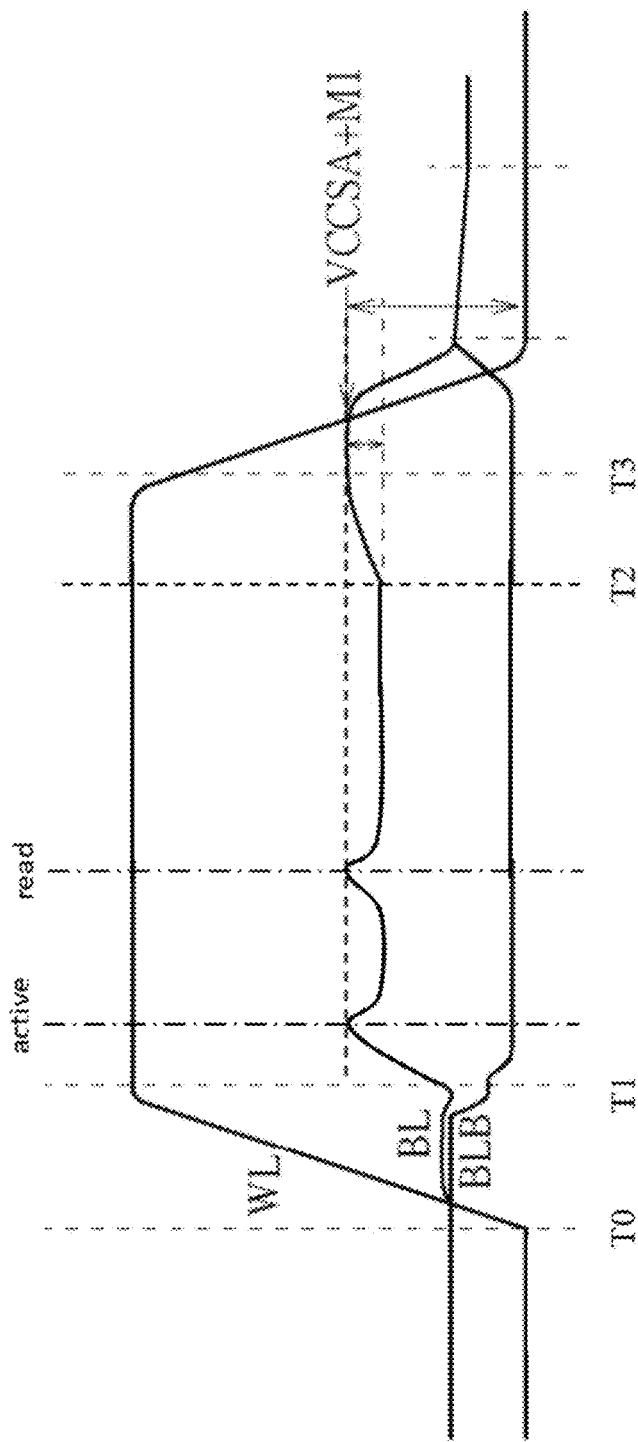
FIG. 8A illustrates the related signal waveforms during the operation of the DRAM cell according to another embodiment of this invention.

FIG. 8A illustrates the related signal waveforms for the operation of the DRAM cell according to another embodiment of this invention. Similar to Example 4, during the period between T1 and T2, there is an active command to be performed and a corresponding first sustaining voltage source (VCCSA+M1) could be connected to the sense amplifier during the active operation. Therefore, the signal of the bit-line would be pumped (or kicked) at least to VCCSA+M1 during the active command. After the performance of the active command, a regular voltage source VCCSA is connected to the sense amplifier and then the signal of the bit-line would be back to VCCSA.

After the active command, one (or more) read command could be performed before T2, and the first sustaining voltage source (VCCSA+M1) could be connected to the sense amplifier again during the read command such that the signal of the bit-line would be pumped (or kicked) at least to VCCSA+M1 during the read command. After the performance of the read command, a regular voltage source VCCSA is connected to the sense amplifier again (by turning off the switch 13 and turn on the switch 14, as shown in FIG. 3A) and then the signal of the bit-line would be back to VCCSA. Such kick for the bit-line during the read command would improve the signal development time. For example, in the event VCCSA is 1.1V and M1 is 0.2V, the signal development time with the kick during the read command is faster around 20%-30% than that without the kick.

Figure 8B:
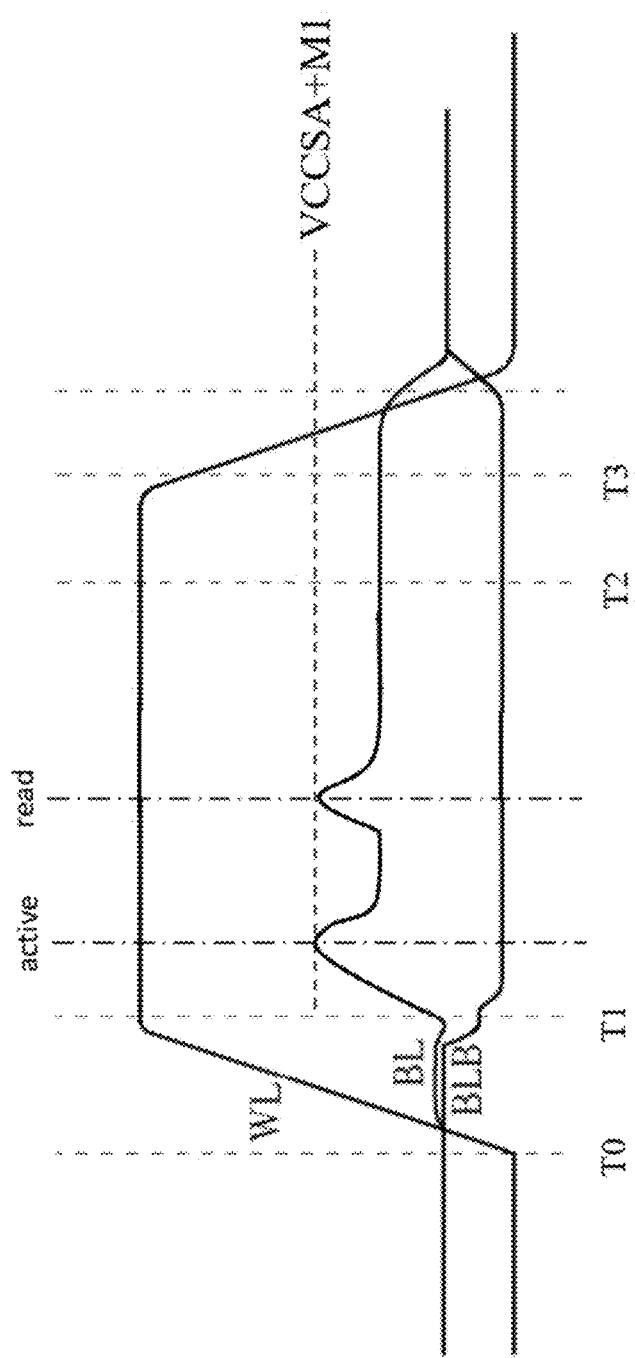
FIG. 8B illustrates the related signal waveforms during the operation of the DRAM cell according to another embodiment of this invention.

Similarly, after T2 during the RESTORE phase, the original VCCSA voltage source is disconnected from the sense amplifier, the first sustaining voltage source VCCSA+M1 will be connected to the sense amplifier 20, and the signal of the bit-line would be pumped (or kicked) at least to VCCSA+M1. Thus, the storage capacitor of the DRAM cell is supplied with the voltage level of the first sustaining voltage source which is higher than that of the regular signal ONE (VCCSA). In another embodiment, however, after T2 during the RESTORE phase, the original VCCSA voltage source (rather than VCCSA+M1) is still connected to the sense amplifier, as shown in FIG. 8B.

Figure 8C:
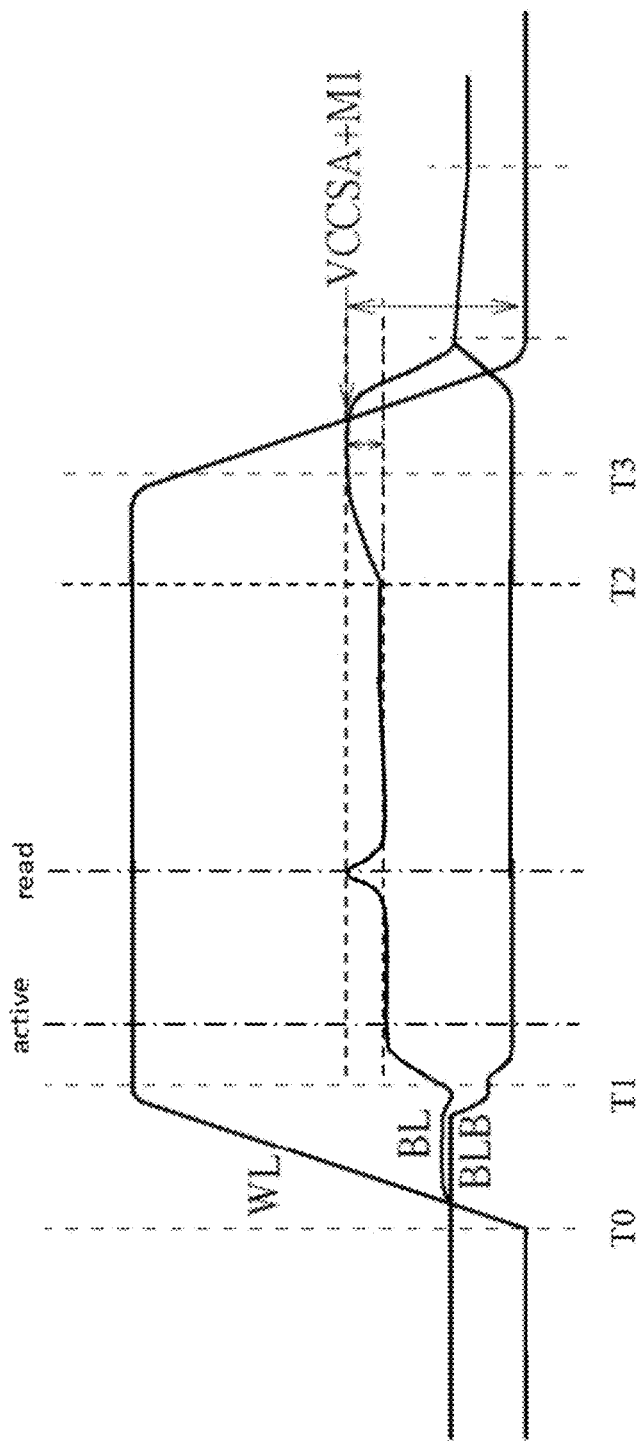
FIG. 8C illustrates the related signal waveforms during the operation of the DRAM cell according to another embodiment of this invention.

Moreover, in other embodiment, the signal of the bit-line is not kicked to VCCSA+M1 during the active command, but the signal of the bit-line is kicked to VCCSA+M1 during the read command. After T2 during the RESTORE phase, the first sustaining voltage source VCCSA+M1 will be connected to the sense amplifier such that the signal of the bit-line would be pumped (or kicked) at least to VCCSA+M1, as shown in FIG. 8C.

Example 6

Figure 8D:
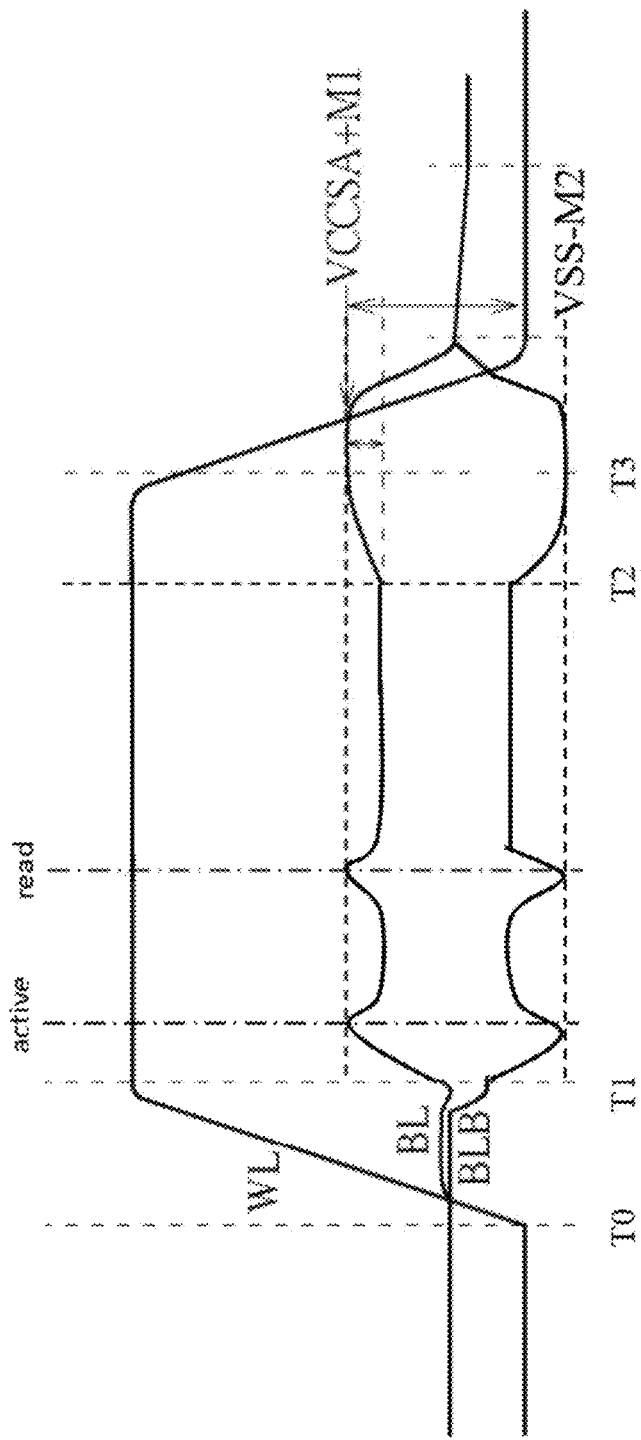
FIG. 8D illustrates the related signal waveforms during the operation of the DRAM cell according to another embodiment of this invention.

FIG. 8D illustrates the related signal waveforms for the operation of the DRAM cell according to another embodiment of this invention. Similar to FIG. 8A, during the period between T1 and T2, there are an active command and at least a read command following the active command to be performed, and a corresponding first sustaining voltage source (VCCSA+M1) could be connected to the sense amplifier (by turning on the switch 13 as shown in FIG. 3A) during the active operation and during the read command.

Furthermore, a corresponding second sustaining voltage source (VSS−M2) could be connected to the sense amplifier (by turning on the switch 23 as shown in FIG. 4A) during the active operation and during the read command. Therefore, the signal of the bit-line (BL) would be pumped (or kicked) at least to VCCSA+M1 and the signal of the bit-line bar (BLB) would be pumped (or kicked) at least to VSS−M2 during the active command and during the read command. After the performance of the active command and the read command, a regular voltage source VCCSA is connected to the sense amplifier (by turning off the switch 13 and turn on the switch 14, as shown in FIG. 3A) and a regular voltage source VSS is also connected to the sense amplifier (by turning off the switch 23 and turn on the switch 24, as shown in FIG. 3B), then the signal of the bit-line would be back to VCCSA and the signal of the bit-line bar would be back to VSS.

Similarly, after T2 during the RESTORE phase, the original VCCSA and VSS voltage sources are disconnected from the sense amplifier (such as, by turning off the switch 14 and switch 24 in FIG. 3A and FIG. 3B respectively), the first sustaining voltage source VCCSA+M1 will be connected to the sense amplifier 20 (by turning on the switch 13 in FIG. 3A) and the second sustaining voltage source VSS−M2 will be connected to the sense amplifier 20 (by turning on the switch 23 in FIG. 3B), and the signal of the bit-line would be pumped (or kicked) at least to VCCSA+M1 and the signal of the bit-line bar would be pumped (or kicked) at least to VSS−M2.

Figure 9:
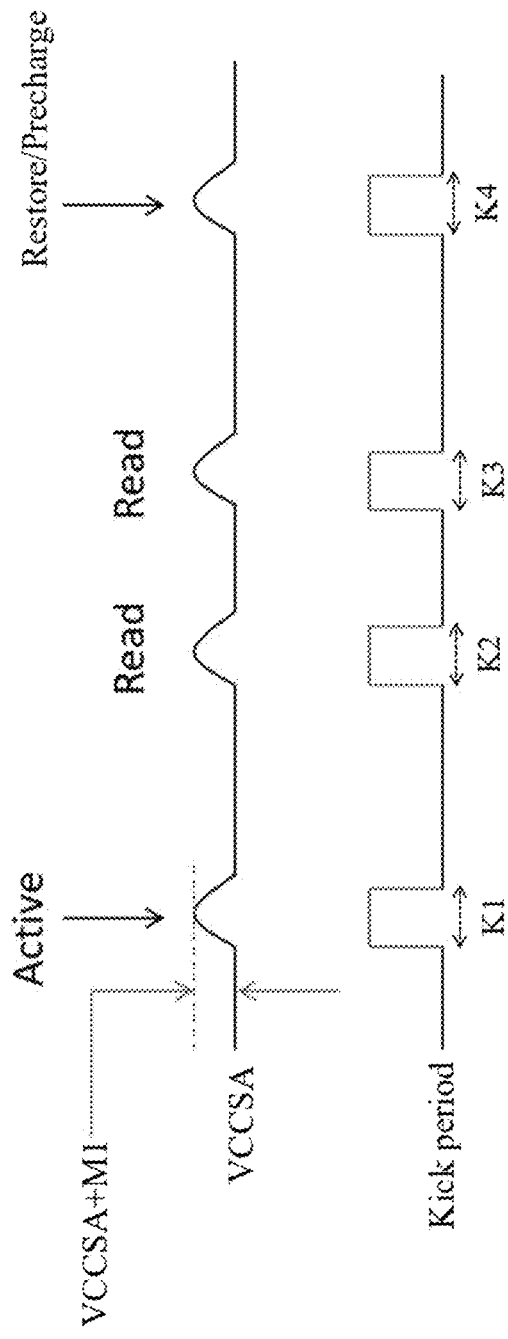
FIG. 9 illustrates the relation between the kick period and the signal of the bit-line during the operation of the DRAM cell according to one embodiment of this invention.

FIG. 9 illustrates the relation between the kick period and the signal of the bit-line during the operation of the DRAM cell. The kick period for the signal of the bit-line corresponding to the RESTORE phase (or precharge) K4 could be longer than that corresponding to the active command K1, or longer than that corresponding to the read command K2 or K3. Furthermore, the kick period for the signal of the bitline corresponding to the active command K1 would be equal to that corresponding to the read command K2 or K3. Of course, during the K1-K3 period, to raise the signal of the bit line up to the voltage level VCCSA+M1 or other the voltage level (such as VCCSA+ΔN, wherein ΔN<M1) could be done by a boostrap circuit in which charges of a capacitor in the boostrap circuit is coupled to the bit line. No matter the voltage source or the boostrap circuit, it could be deemed as a charge source, thus, the signal of the bit line could be kicked or pumped to the voltage level VCCSA+M1 or VCCSA+ΔN by a charge source. So is the signal of the bit line kicked to VSS−M2 (or VSS−AN, wherein ΔN<M2).

Example 7

Figure 10A:
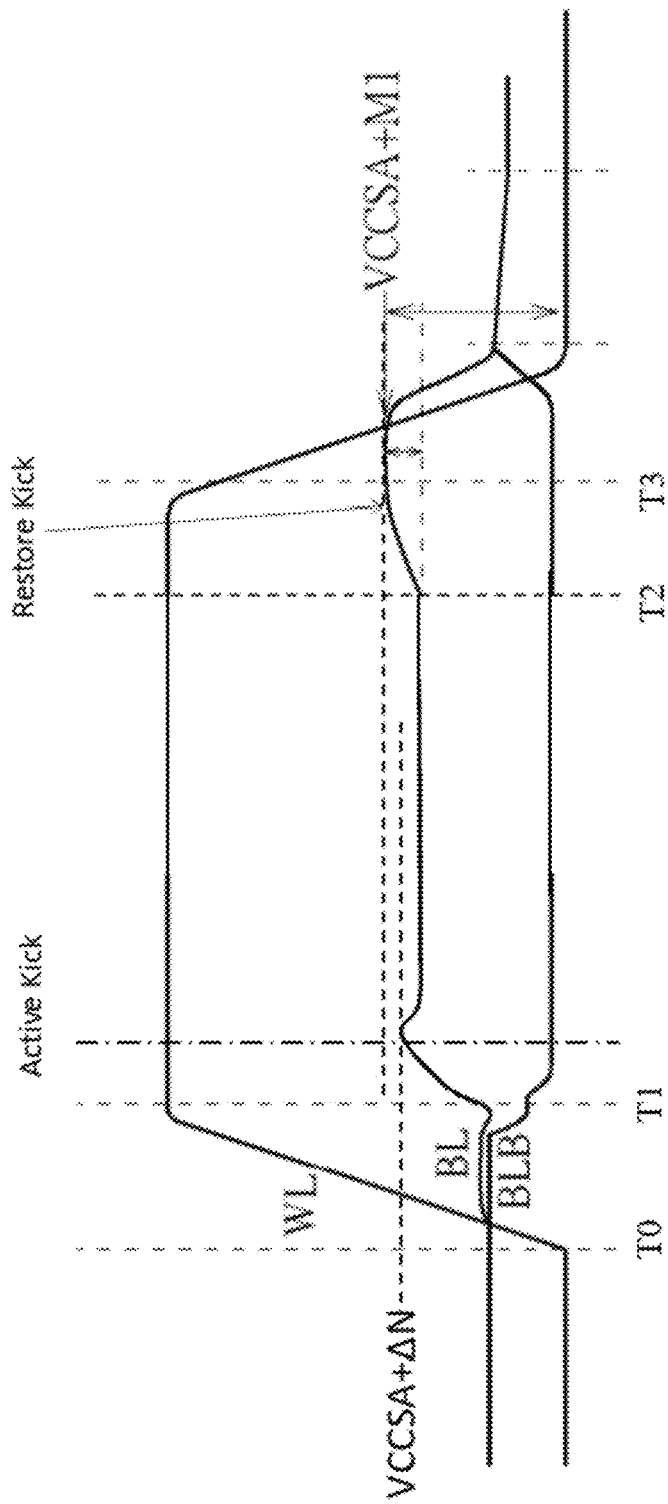
FIG. 10A illustrates the related signal waveforms during the operation of the DRAM cell according to another embodiment of this invention.

In another embodiment, as shown in FIG. 10A, after T0, the word-line voltage is ramping up in order to turn on the access transistor of the DRAM cell. Then in regular READ or WRITE access for DRAM, there is an active command to be performed. A corresponding voltage which is a little bit higher than VCCSA (such as VCCSA+ΔN) could be connected to the sense amplifier (by turning off the switch 14 and turning on the switch 13 as shown in FIG. 3A) during the performance of the active command to reduce tRCD defined by JEDEC. Such voltage level or voltage source is coupled to the bit line during the period between T1 and T2 (that is, the access operation period). Thus, the corresponding voltage source (VCCSA+ΔN) could be connected to the sense amplifier according to active command. Therefore, the signal of the bit-line would be pumped (or kicked) at least to VCCSA+ΔN during the performance of the active command. Such pump or kick in bit-line signal could be named as active kick. Such active kick for the bit-line would expedite the signal sensing. Again, to raise the bit line up to the voltage level VCCSA+ΔN could be done by a boostrap circuit in which charges of a capacitor in the boostrap circuit is coupled to the bit line. No matter the voltage source or the boostrap circuit, it could be deemed as a charge source, thus, the bit line could be kicked or pumped to the voltage level VCCSA+ΔN by a charge source.

After the performance of the active command or active kick, a regular voltage source VCCSA is connected to the sense amplifier and then the signal of the bit-line would be back to VCCSA during the following READ or WRITE operation. Similarly, after T2 during the RESTORE phase, the first sustaining voltage source VCCSA+M1 (or a different sustaining voltage which is higher than VCCSA) is again coupled to the capacitor of the DRAM cell during this RESTORE phase. That is, during this RESTORE phase, the original VCCSA voltage source is disconnected from the sense amplifier (such as, by turning off the switch 14 as shown in FIG. 3A), and the first sustaining voltage source VCCSA+M1 will be connected to the sense amplifier 20 (such as, by turning on the switch 13 as shown in FIG. 3A). The signal of the bit-line would be pumped (or kicked) at least to VCCSA+M1. Such pump or kick in bit-line signal could be named as restore kick. Thus, before the word-line WL is pulled down to fully turn off the access transistor of the DRAM cell, the storage capacitor of the DRAM cell is supplied with the voltage level of the first sustaining voltage source which is higher than that of the regular signal ONE (VCCSA), and the storage capacitor of the DRAM cell can sustain for a longer period compared with conventional DRAM structure even there is leakage current through the access transistor.

In one embodiment, the corresponding voltage (VCCSA+ΔN) used in active kick is lower than the first sustaining voltage (VCCSA+M1) used in restore kick. The corresponding voltage (VCCSA+ΔN) and the first sustaining voltage (VCCSA+M1) could be generated from two different voltage sources respectively. Alternatively, the corresponding voltage (VCCSA+ΔN) used in active kick to kick the voltage of bit line may be generated from the first sustaining voltage source (VCCSA+M1), but the duration for connecting the first sustaining voltage source (VCCSA+M1) to the bit line is adjusted such that the bit line is just pumped or kicked to the corresponding voltage (VCCSA+ΔN), rather than (VCCSA+M1). Of course, in the present invention, the voltage (VCCSA+M1), the voltage (VCCSA+ΔN), and the voltage (VCCSA) could be generated or converted internally in the DRAM, or could be supplied or converted from other voltage sources external to the DRAM chip.

Figure 10B:
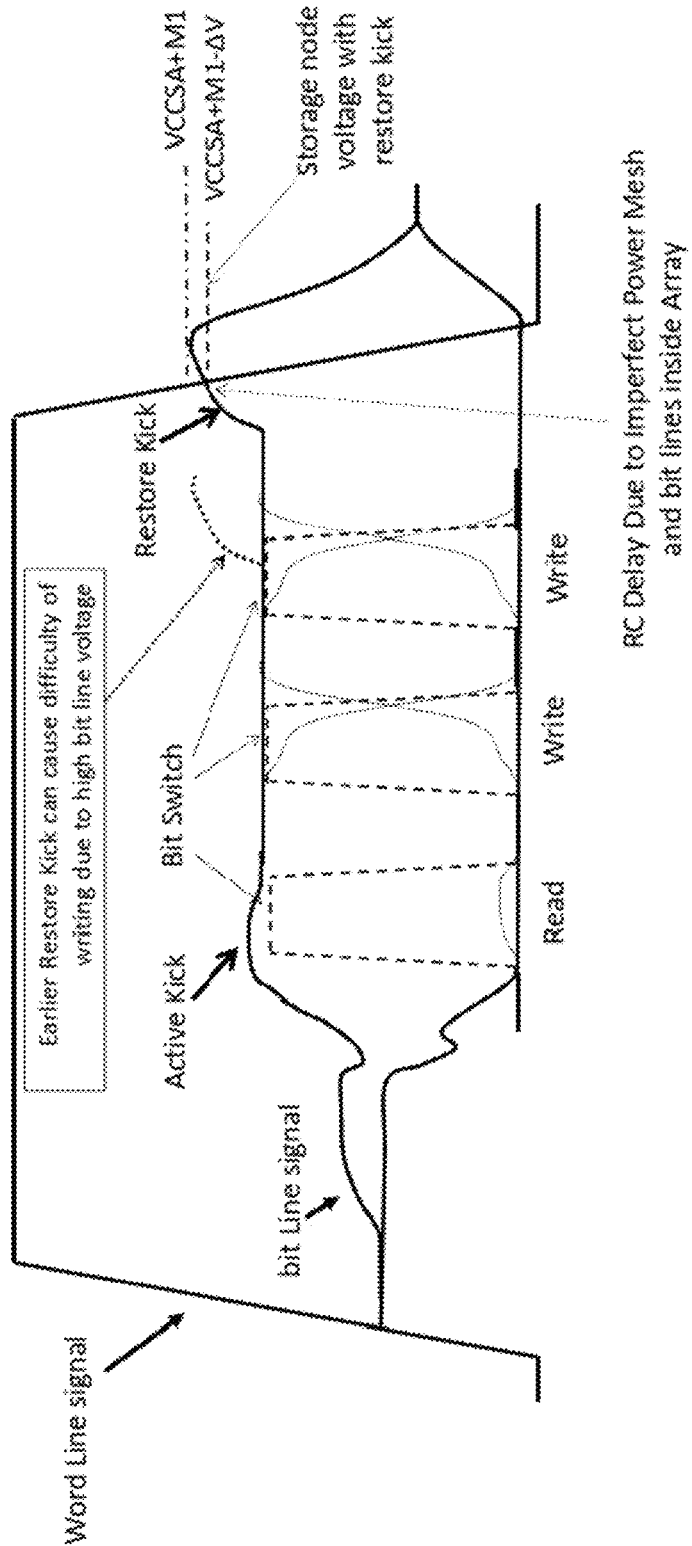
FIG. 10B illustrates the related signal waveforms during the operation of the DRAM cell according to another embodiment of this invention.

However, as shown in FIG. 10B, during the restore kick, the first sustaining voltage source VCCSA+M1 may not pull up the voltage level of the bit-line quickly in the event there is RC delay due to imperfect power mesh and bit lines inside DRAM array or other delay causes. That is, the restore kick may not cause the voltage level of the first sustaining voltage source VCCSA+M1 to be fully stored in the DRAM storage node or cell through the bit-line, and probably only the voltage level of (VCCSA+M1−ΔV) will be stored in the DRAM storage node or cell. Moreover, in the regular access command of the DRAM, as shown in FIG. 10B, there is READ or WRITE operation to be performed between the active kick and restore kick, it is not suitable to perform earlier restore kick to overcome the RC delay issue.

Figure 11A:
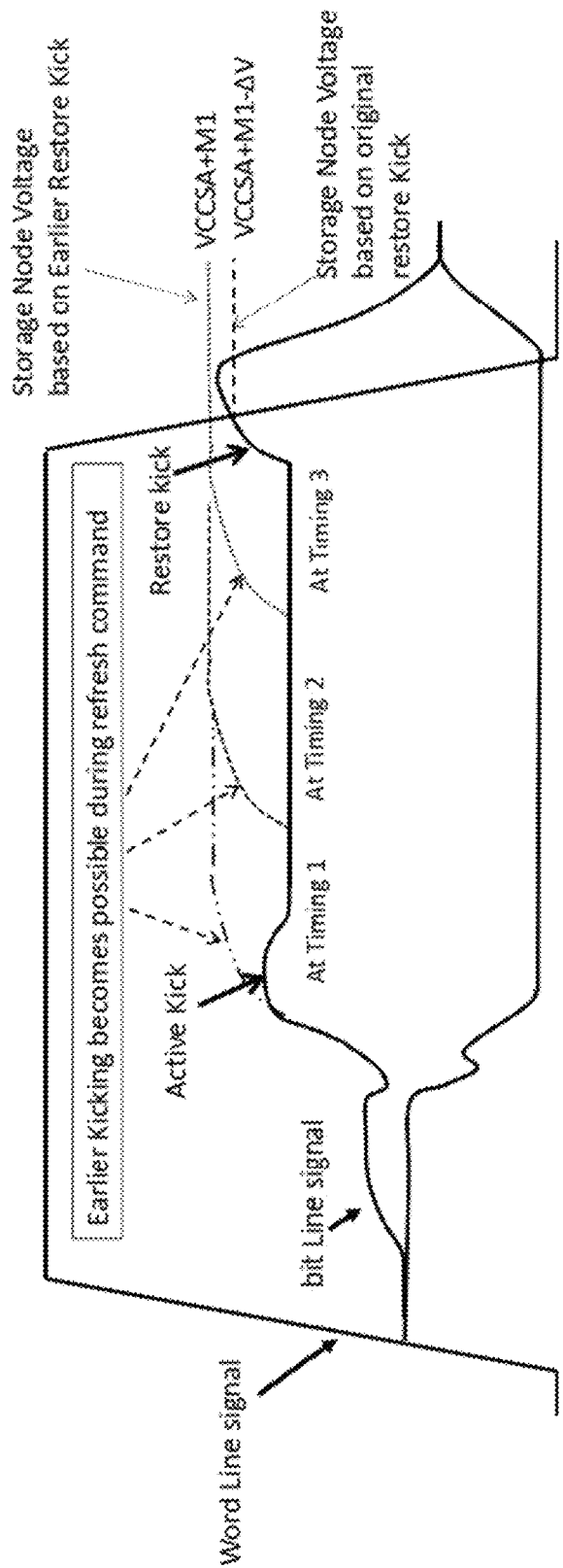
FIG. 11A illustrates the related signal waveforms during the refresh operation of the DRAM cell according to another embodiment of this invention.

Nevertheless, as shown in FIG. 11A, for the performance of the refresh command in DRAM, there is no READ or WRITE operation included in the refresh command. Thus, it is suitable to perform the restore kick in advance (hereinafter "earlier restore kick", such as at timing 1, timing 2, or timing 3) to overcome the RC delay issue, such that the earlier restore kick could cause the voltage level of the first sustaining voltage source VCCSA+M1 to be completely or substantially stored in the DRAM storage node or cell through the bit-line, rather than the voltage level of "VCCSA+M1-AV" based on the previous "restore kick" only described in FIG. 10B. Therefore, the storage capacitor can sustain for a longer retention time.

Figure 11B:
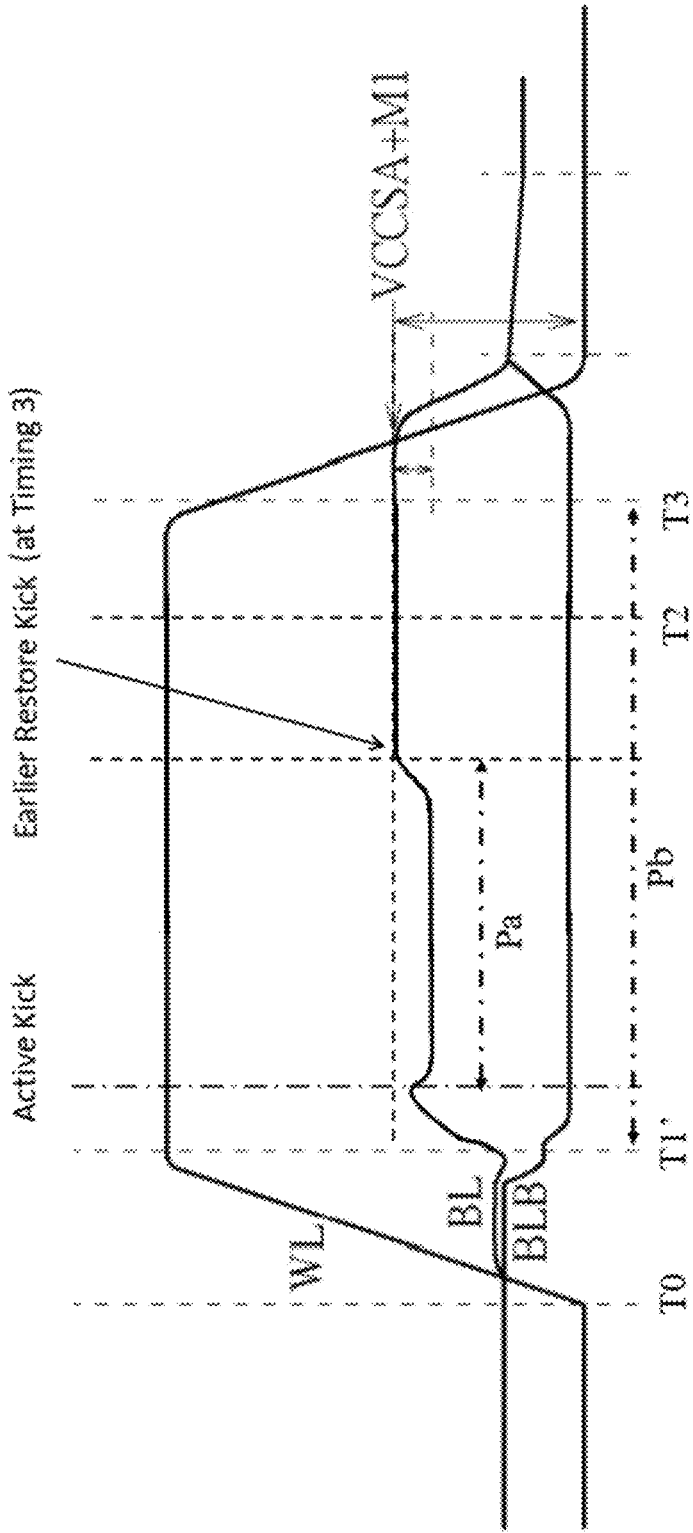
FIG. 11B illustrates the related signal waveforms during the refresh operation of the DRAM cell according to another embodiment of this invention, in which the earlier restore kick begins at timing 3.

There is reliability concern when VCCSA+M1 is too high (for example, when VCCSA is 1.1V, the value of 1.5V or 1.6V for VCCSA+M1 may be too high). Therefore, optimized voltage and earlier kick timing is essential. Different timing for earlier restore kick can be generated by internal timing control during refresh. FIG. 11B (Earlier Restore Kick at Timing 3) shows that the period Pa between the active kick and earlier restore kick is less than 50% or 60% of the period Pb between T1' and T3, wherein T1' is the time when the voltage difference between the bit-line and bit-line bar is separately enough for sense amplifier to sense, and T3 is the time when the voltage level of the word-line begins to be pulled down. Therefore, the period Pb includes a kick period for the active kick, another period (or the first period) in which the VCCSA voltage source is coupled to the bit line, and another period (or the second period) in which the VCCSA+M1 voltage source is coupled to the bit line. The VCCSA+M1 voltage could be applied to the bit line (so is the storage capacitor of the DRAM cell) approximately more than 20% or 30% of the period Pb. In another example, the active kick may be not required during refresh operation, that is, the waveform of the bit line during the refresh will only has restore kick.

Figure 11C:
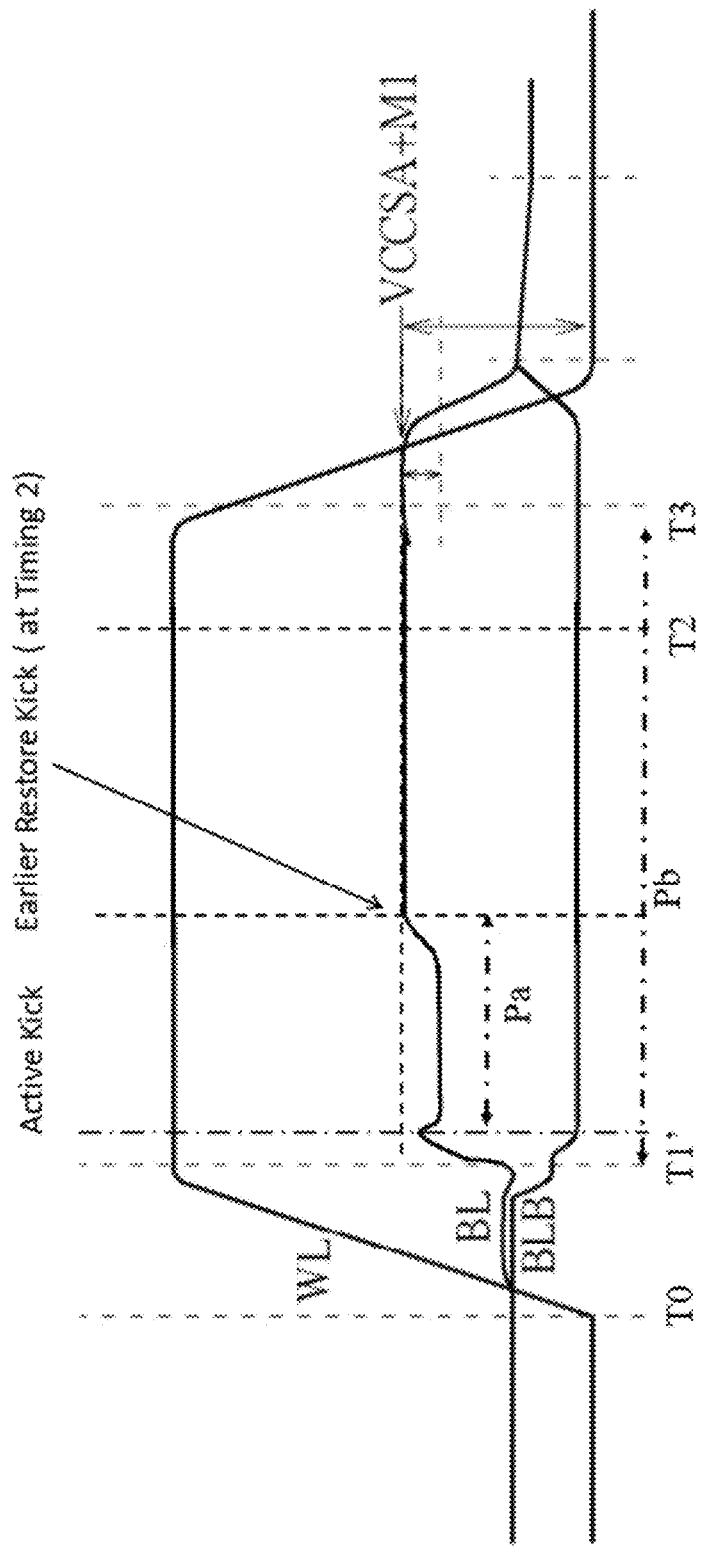
FIG. 11C illustrates the related signal waveforms during the refresh operation of the DRAM cell according to another embodiment of this invention, in which the earlier restore kick begins at timing 2.
Figure 11D:
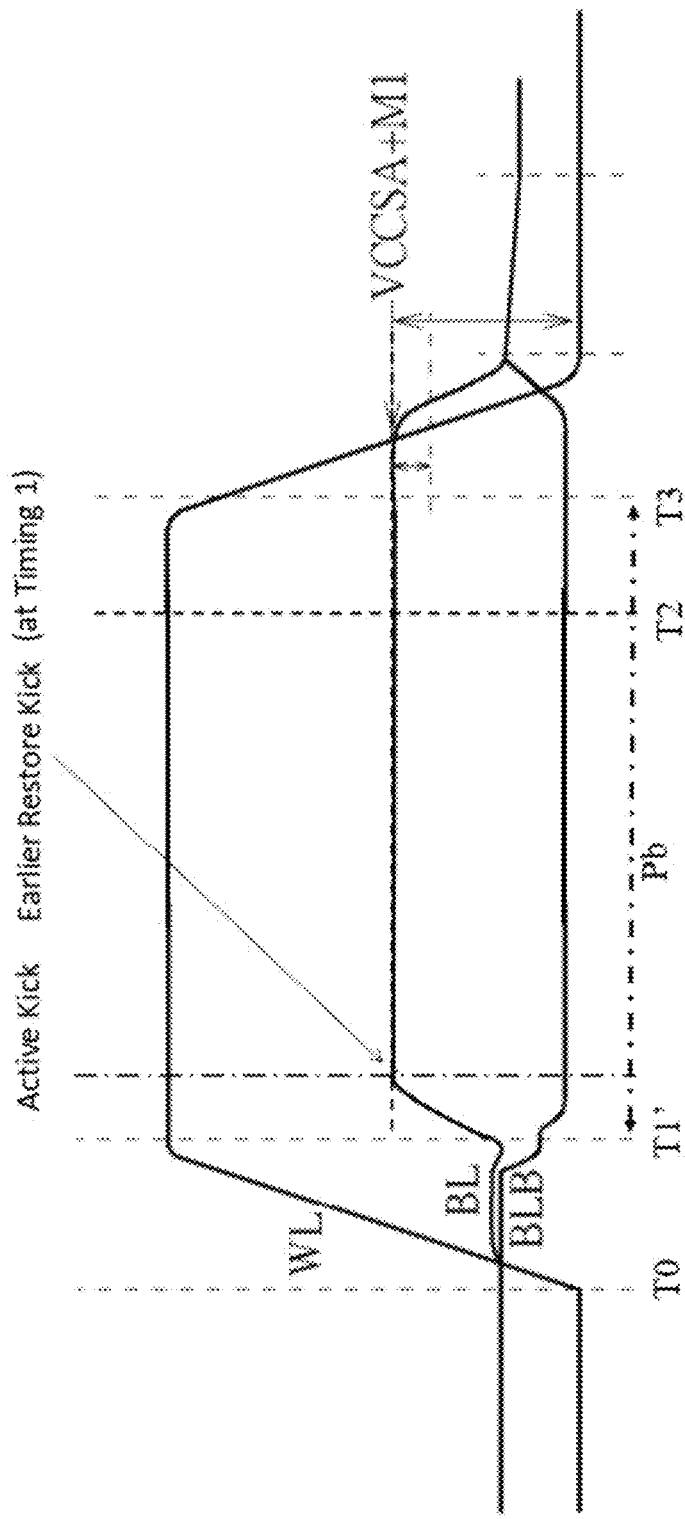
FIG. 11D illustrates the related signal waveforms during the refresh operation of the DRAM cell according to another embodiment of this invention, in which the earlier restore kick begins at timing 1.

FIG. 11C (Earlier Restore Kick at Timing 2) shows that the period Pa between the active kick and earlier restore kick is less than 30% of the period Pb between T1' and T3. Therefore, the VCCSA+M1 voltage could be applied to the bit line approximately to more than 50% or 60% of the period Pb. FIG. 11D (Earlier Restore Kick at Timing 1) shows that the period Pa is zero, that is, the earlier restore kick is used to replace the active kick and will sustain until the voltage level of the word-line is pulled down. Therefore, the VCCSA+M1 voltage could be applied to the bit line approximately to more than 90% of the period Pb. However, if there is any reliability concern when a higher kick voltage is continuously applied to sense amplifier and the DRAM cell, the kick voltage VCCSA+M1 in utilized FIG. 11D (Earlier Restore Kick at Timing 1) may be smaller than that utilized in FIG. 8C (Earlier Restore Kick at Timing 2). For example, when VCCSA=1.1V, the kick voltage VCCSA+M1 utilized in FIG. 11D (Earlier Restore Kick at Timing 1) may be 1.3V, the kick voltage VCCSA+M1 utilized in FIG. 11C (Earlier Restore Kick at Timing 2) may be 1.31-1.35V, and the kick voltage VCCSA+M1 utilized in FIG. 11B (Earlier Restore Kick at Timing 3) may be 1.36-1.4V.

Example 8

Figure 1A:
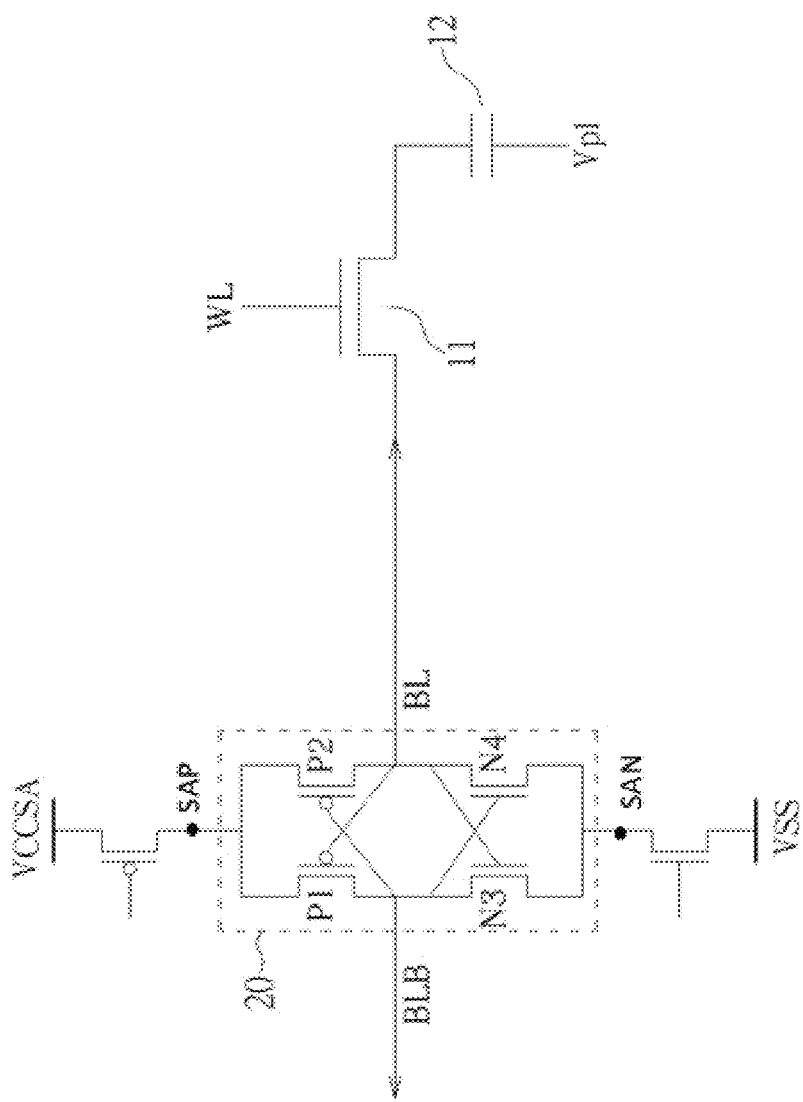
FIG. 1A illustrates commonly used design of the DRAM cell.
Figure 1B:
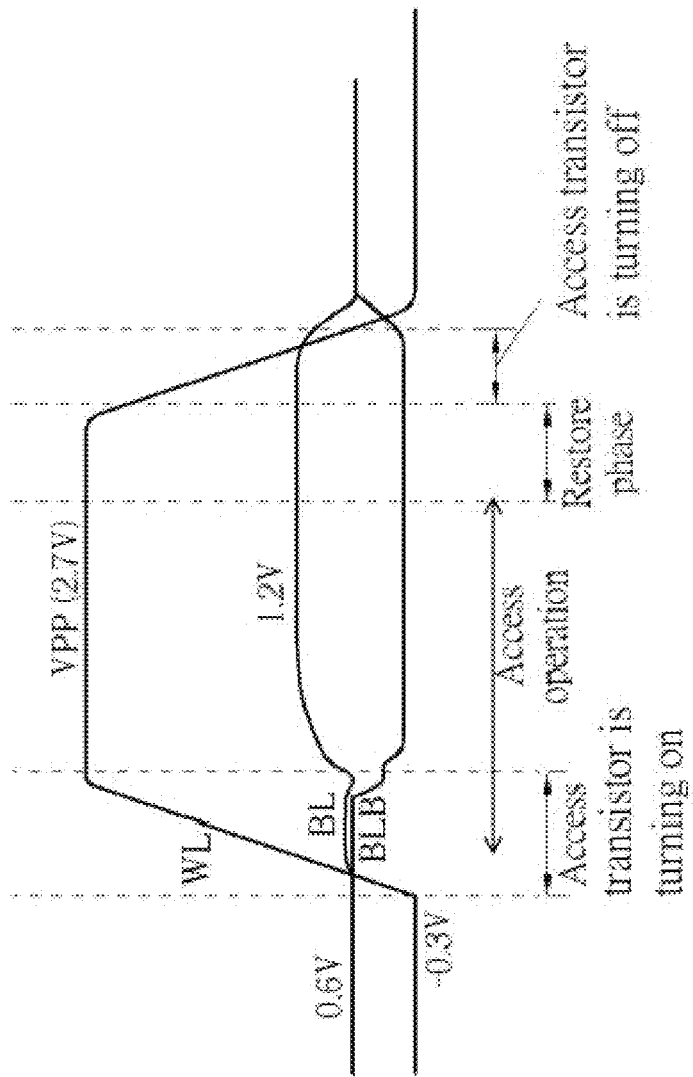
FIG. 1B illustrates the related signal waveforms during access (READ or WRITE) operation of most current DRAMs.

On the other hand, in conventional DRAM operation shown in FIGS. 1B and 1H, after the restore phase and the voltage of the wordline is reduced from VPP (or a value higher than Vcc+Vt) to a lower voltage value (such as −0.3V) to inactivate the access transistor of the DRAM cell, a precharge phase will begin and the voltage equalization circuit 21 will activate to place a reference voltage Vref to both the bitline and the $\overline{\text{bitline}}$. Such Vref is equal to ½*VCCSA (or ½*Vcc), or equal to the bit lines equalization voltage VBL halfway between the voltage on the bitline and the voltage on the $\overline{\text{bitline}}$ during the restore phase. In the conventional DRAM circuit, the value of VBL is also equal to ½*VCCSA (or ½*Vcc).

In the present invention, the voltage on the bitline during the restore phase is kicked up to VCCSA+M1 or a voltage higher than VCCSA (hereinafter "VCCSAh" or "V2") through the sense amplifier circuit. Similarly, after the restore phase and the voltage of the wordline is reduced to inactivate the access transistor of the DRAM cell, a precharge phase will begin and the voltage equalization circuit will activate to place a reference voltage Vref to both the bitline (hereinafter "BL") and the $\overline{\text{bitline}}$ (hereinafter, bitline Bar or "BLB"). The target value of the reference voltage Vref (or the targeted bit lines equalization voltage VBL) is set to ½*VCCSA or ½*Vcc. However, in this situation, the bit lines equalization voltage VBL halfway between the voltage on the bitline and the voltage on the $\overline{\text{bitline}}$ during the restore phase will be ½VCCSAh which is higher than the target reference voltage ½*VCCSA.

Figure 12:
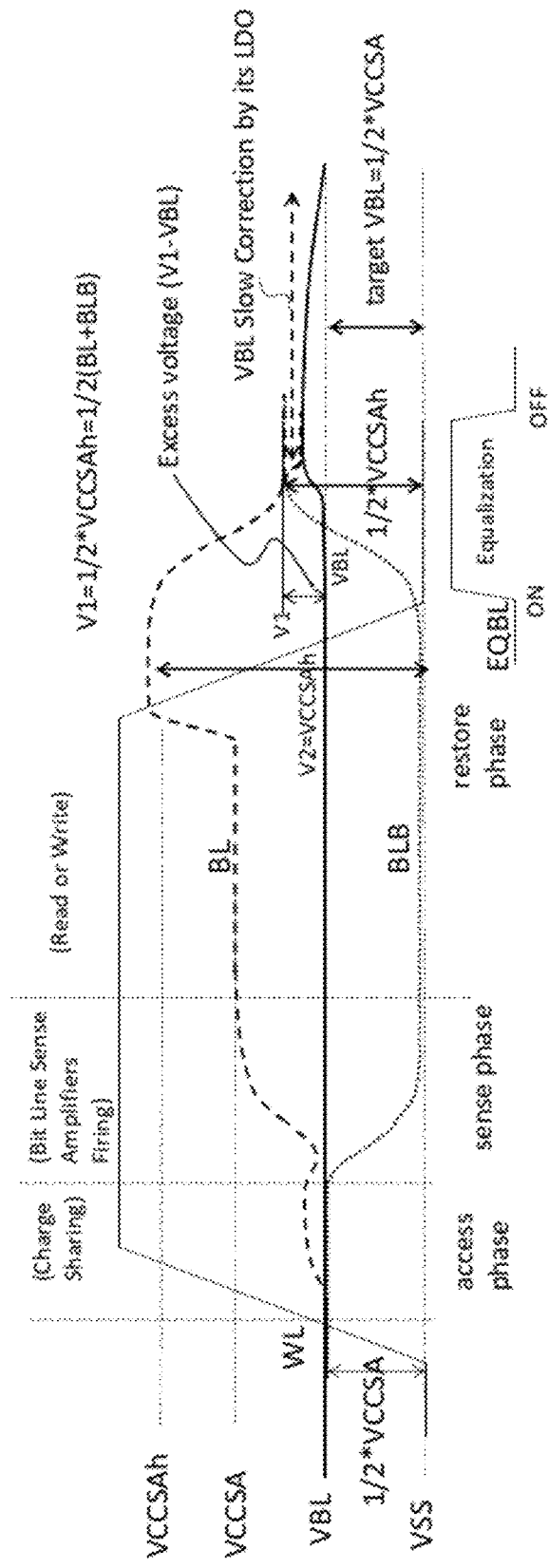
FIG. 12A illustrates the related signal waveforms when the voltage of BL is kicked up to VCCSAh during the restore phase.
FIG. 12B illustrates another related signal waveforms between two wordline activations, wherein the voltage of BL is kicked up to VCCSAh during the restore phase.
Figure 12:
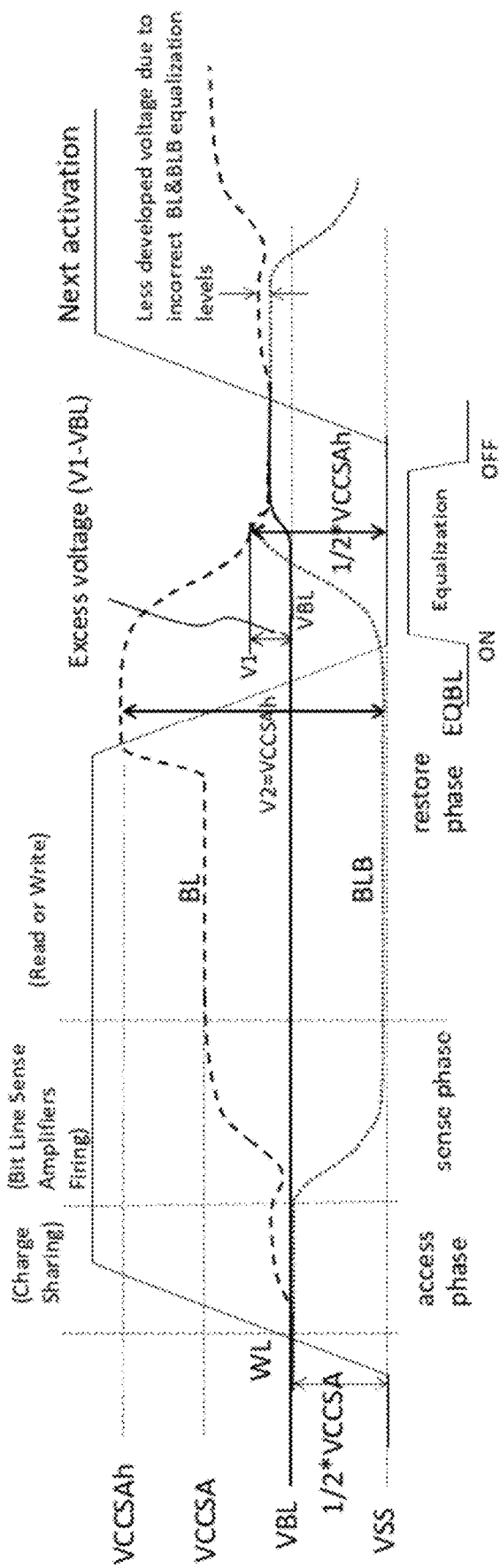

As shown in FIG. 12A illustrating the timing diagram for the aforesaid operation, due to the kicked voltage VCCSAh (or "V2", the restore voltage into storage node of a cell) for the bitline, at the beginning of equalization, BL and BLB will be first drawn to V1 (that is, the charge shared voltage between BL and BLB at the beginning of bitlines equalization) which is ½*VCCSAh, then gradually reduced to targeted VBL voltage (½*VCCSA). Because V1 is not equal to targeted VBL (such as, V1>½*VCCSA), the excessive voltage (V1−the targeted VBL) can cause the temporary bit lines equalization voltage VBL up while equalization. After the voltage equalization circuit is inactive at the end of the equalization period EQBL, the voltage value of BL, BLB and the temporary bit lines equalization voltage VBL are still in the incorrect voltage levels. Thus, it is required to wait for the low dropout circuit (LDO) of VBL generator to correct the temporary bit lines equalization voltage VBL back to the target value of VBL (½*VCCSA). The correction time is slow such that next activation would be affected. For example, as shown in FIG. 12B, in the event the next active command happens after the end of the equalization period EQBL, but the temporary bit lines equalization voltage VBL is still higher than the targeted VBL (or the targeted reference voltage), it will damage the following small signal development by the next active command. Therefore, it is necessary to clean up the excessive voltage (V1−the targeted VBL) during the equalization period such that the correct bit lines equalization voltage level (that is, the targeted VBL=½*VCCSA) and the correct developed voltage by the next active command can be achieved.

Thus, as shown in FIG. 12A or FIG. 12B, the bitline voltage is kicked up during the restore phase, then the voltage of the wordline is reduced to inactivate the access transistor of the DRAM cell, thereafter the equalization circuit is activated. Nevertheless, the excessive voltage (V1−the targeted VBL) will affect the next active command. Therefore, a cleanup circuit is proposed, and the excessive voltage (V1−the targeted VBL) or excess charges in the BL/BLB during the equalization would be reduced or clean through the help of the clean up circuit, such that before the next wordline activation both BL and BLB will be set to targeted VBL (that is, ½*VCCSA).

Figure 13:
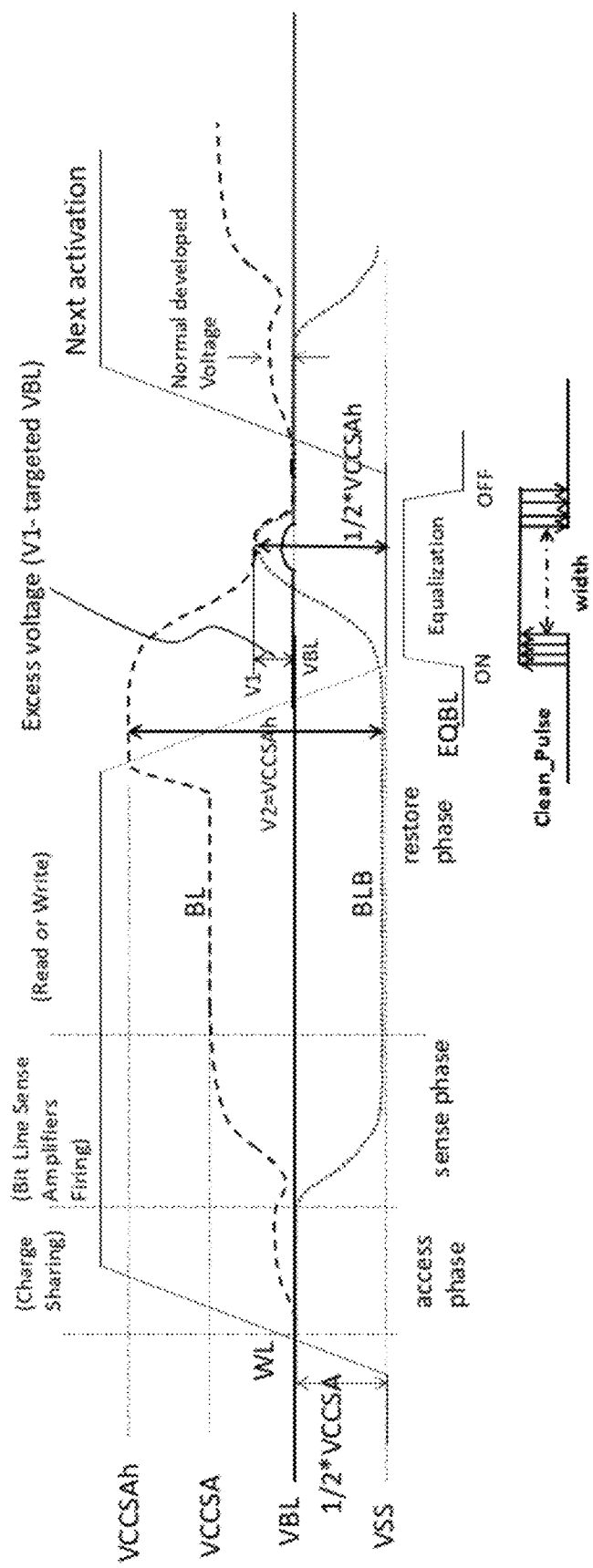
FIG. 13 illustrates another related signal waveforms between two wordline activations, wherein the voltage of BL is kicked up to VCCSAh during the restore phase and a clean up circuit is activated during the equalization.

As shown in FIG. 13, the clean up circuit is controlled by a clean pulse. The starting time of the clean pulse could be similar to EQBL ON timing, or triggered by the rising of the EQBL pulse. The width of the clean pulse depends on the restore voltage (VCCSAh), higher the restore voltage, more excessive voltage (V1−targeted VBL), therefore wider clean pulse width is required. With the help of the cleanup circuit controlled by the clean pulse, the voltage of BL/BLB is quickly changed from V1 to the targeted VBL (½*VCCSA) before the next activation of the wordline, so is the temporary bit lines equalization voltage VBL. Therefore, the correct bit lines equalization voltage level (that is, the targeted VBL=½*VCCSA) and the correct developed voltage by the next active command can be achieved.

Figure 1C:
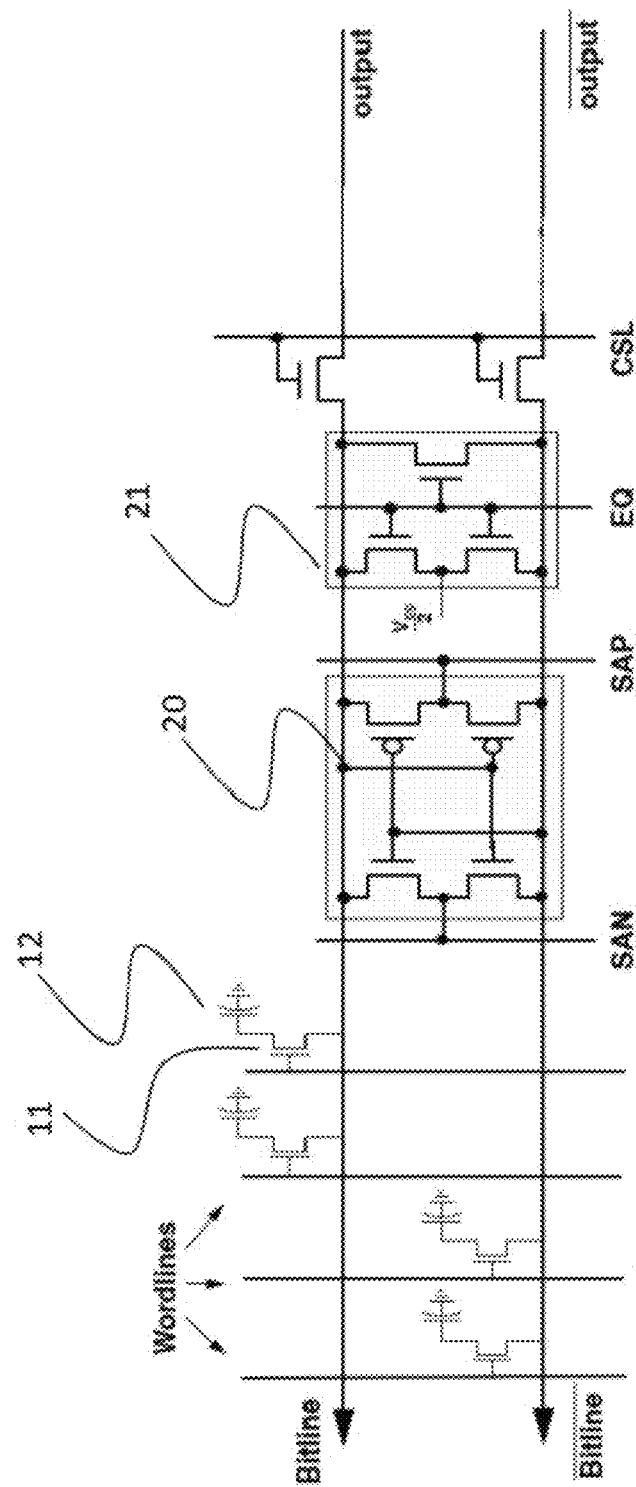
FIG. 1C illustrates a conventional the DRAM circuit with a sense circuit and a voltage equalization circuit.
Figure 1D:
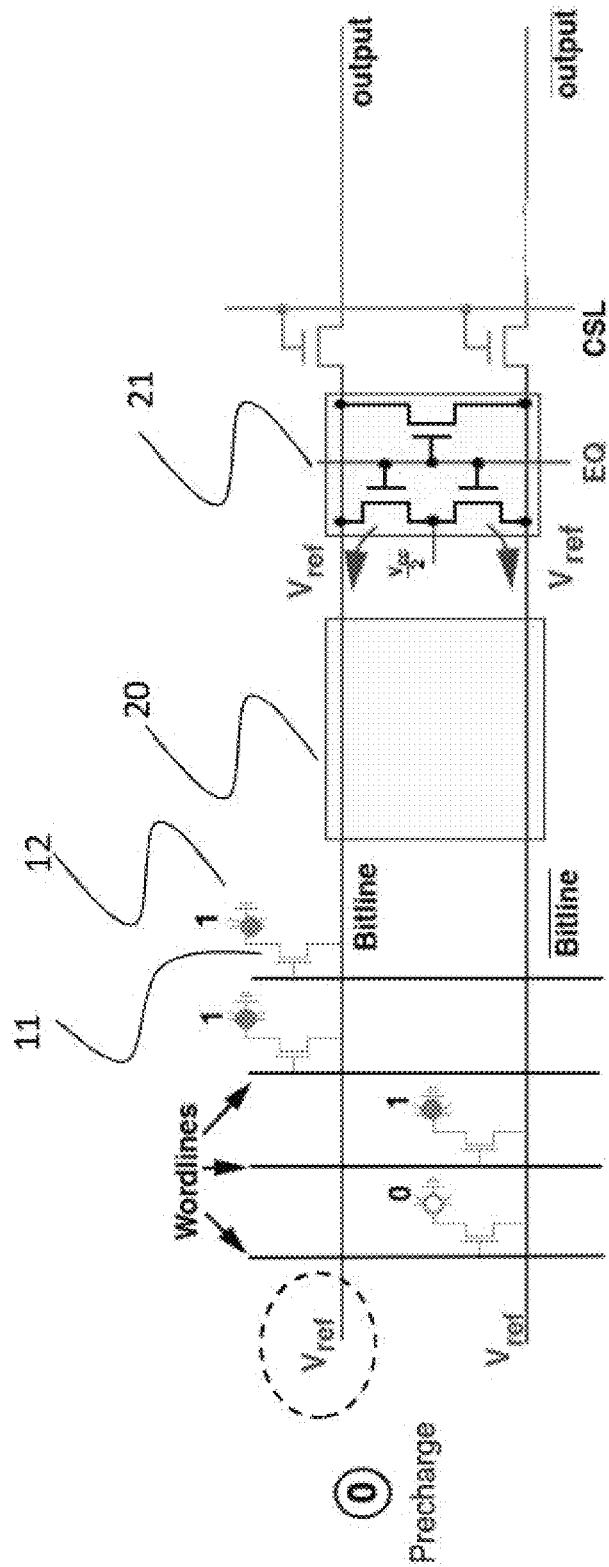
FIG. 1D-1G illustrates four different phases regarding operations of the sense amplifier, including precharge, access, sense, and restore phases regarding an access-read operation to the conventional DRAM cells.
Figure 1E:
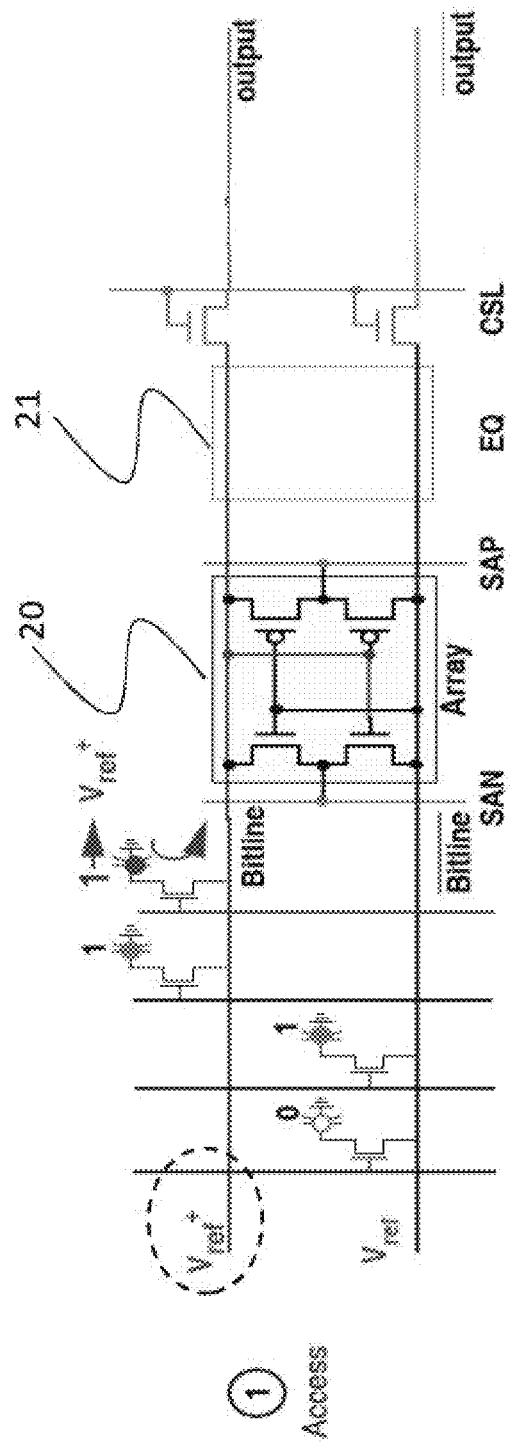
Figure 1F:
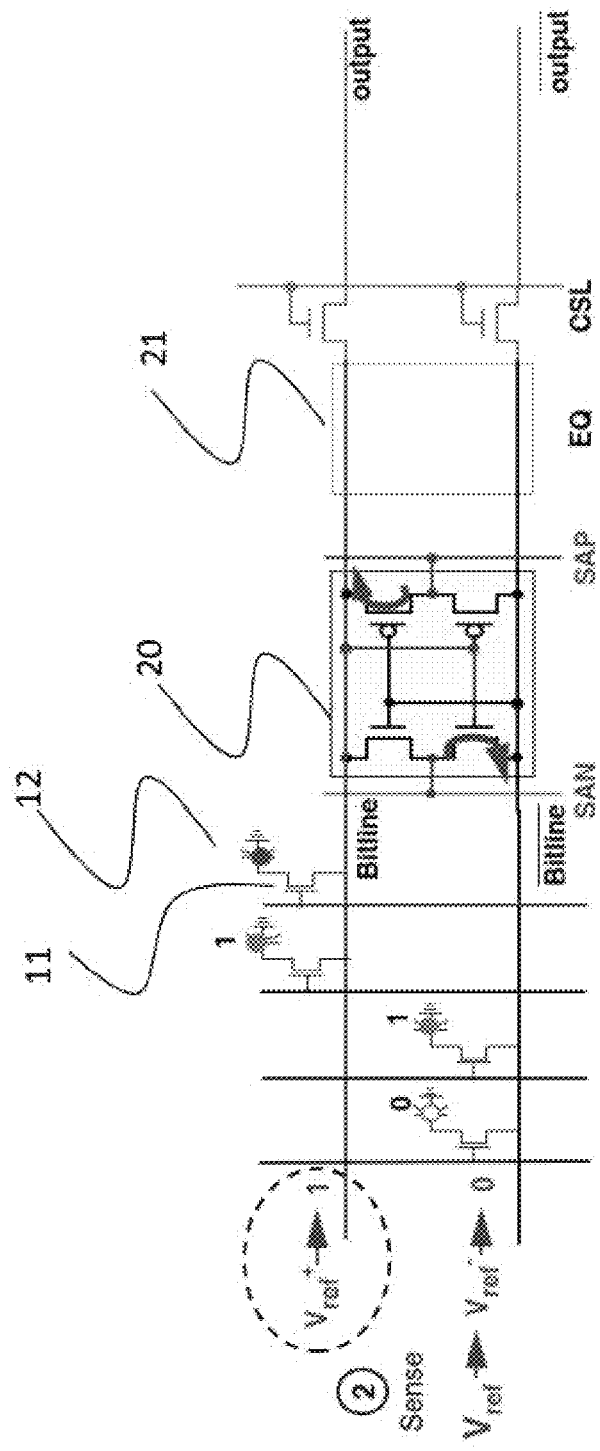
Figure 1G:
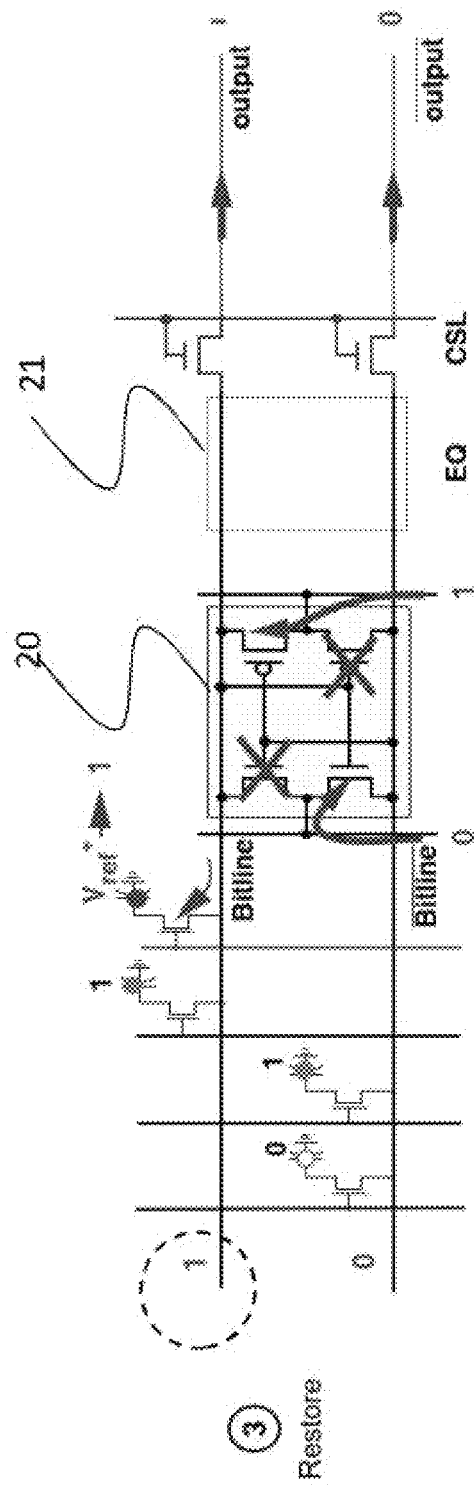
Figure 14A:
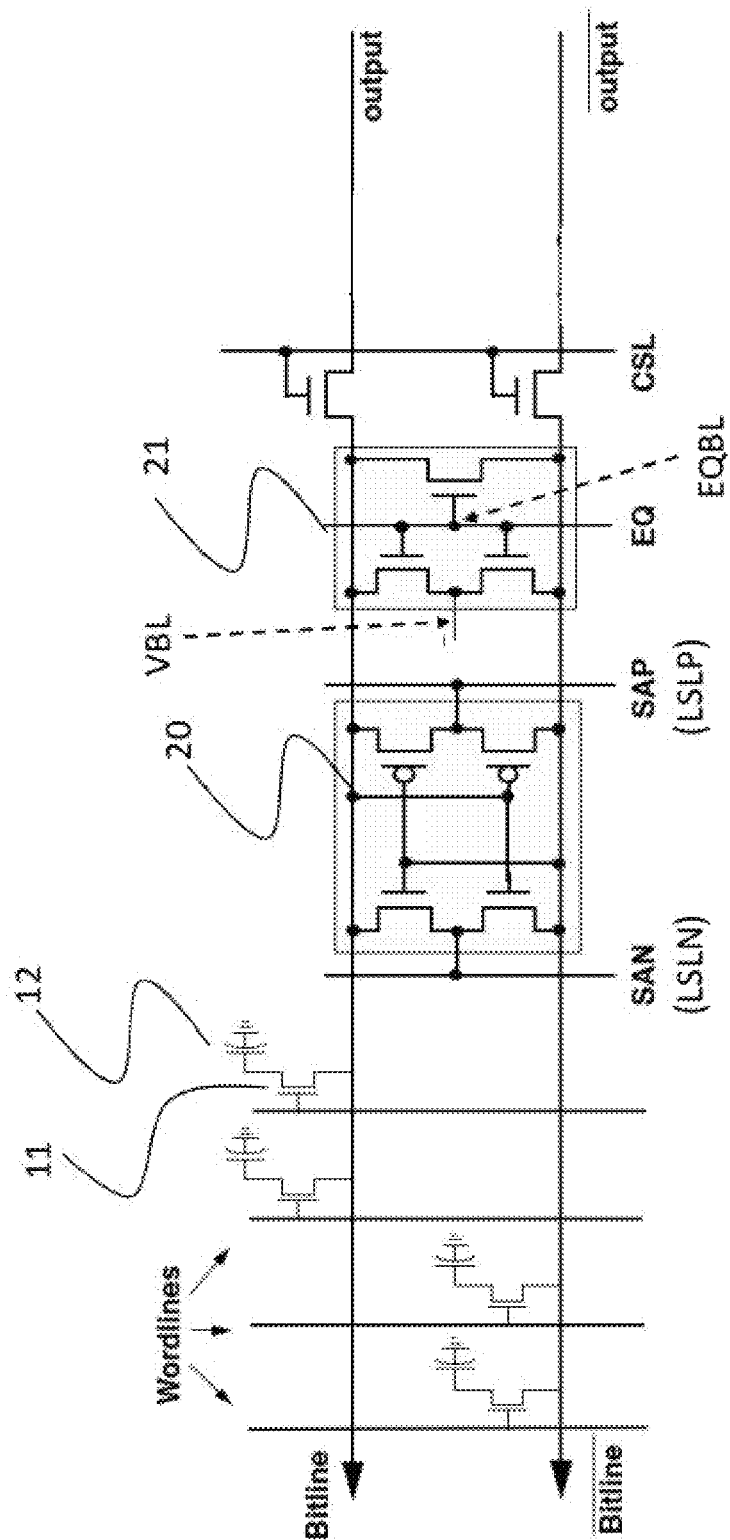
FIG. 14A illustrates a conventional the DRAM circuit with a sense circuit and a voltage equalization circuit.
Figure 14B:
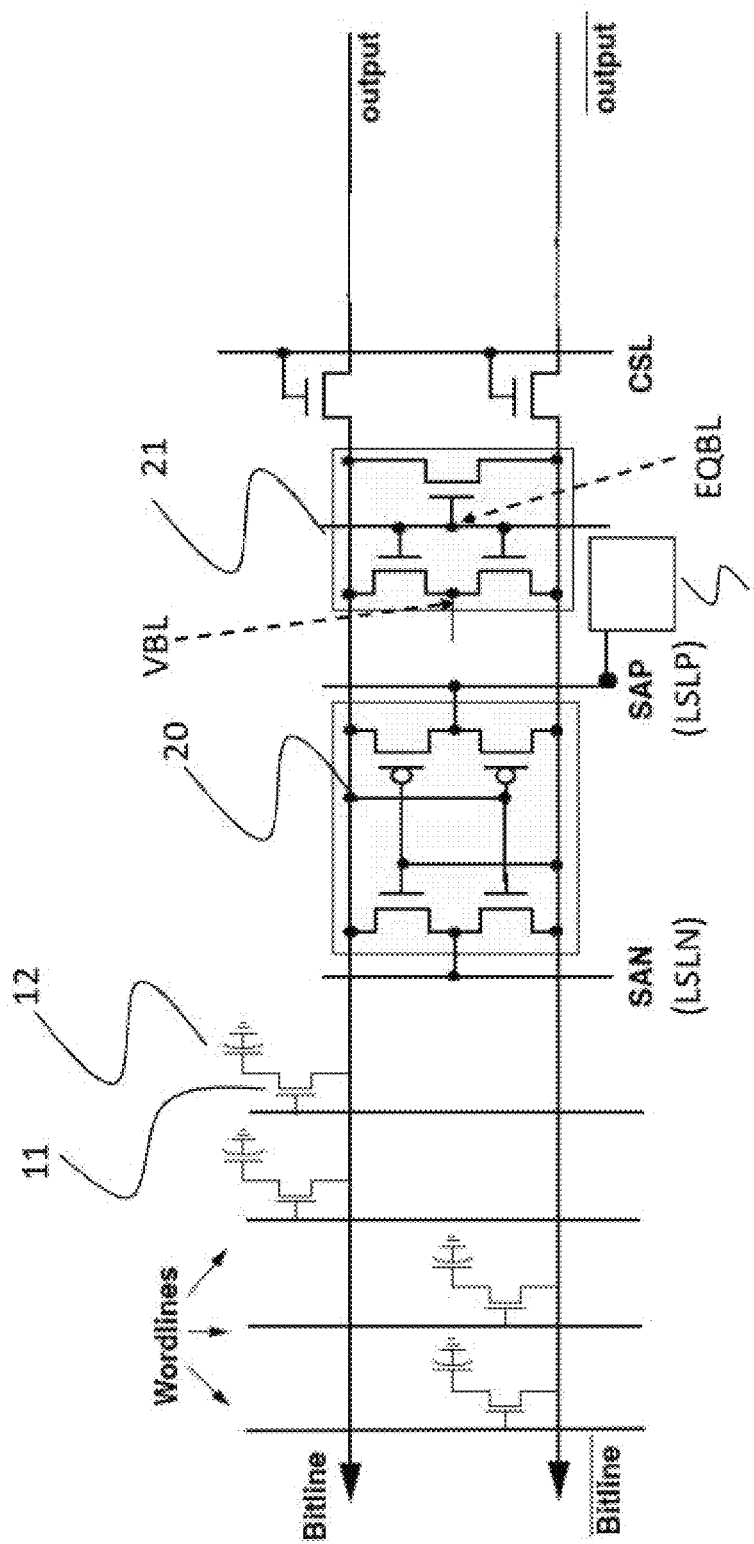
FIG. 14B illustrates the DRAM circuit according to the present invention, wherein a clean up circuit is coupled to the sense circuit.
Figure 14C:
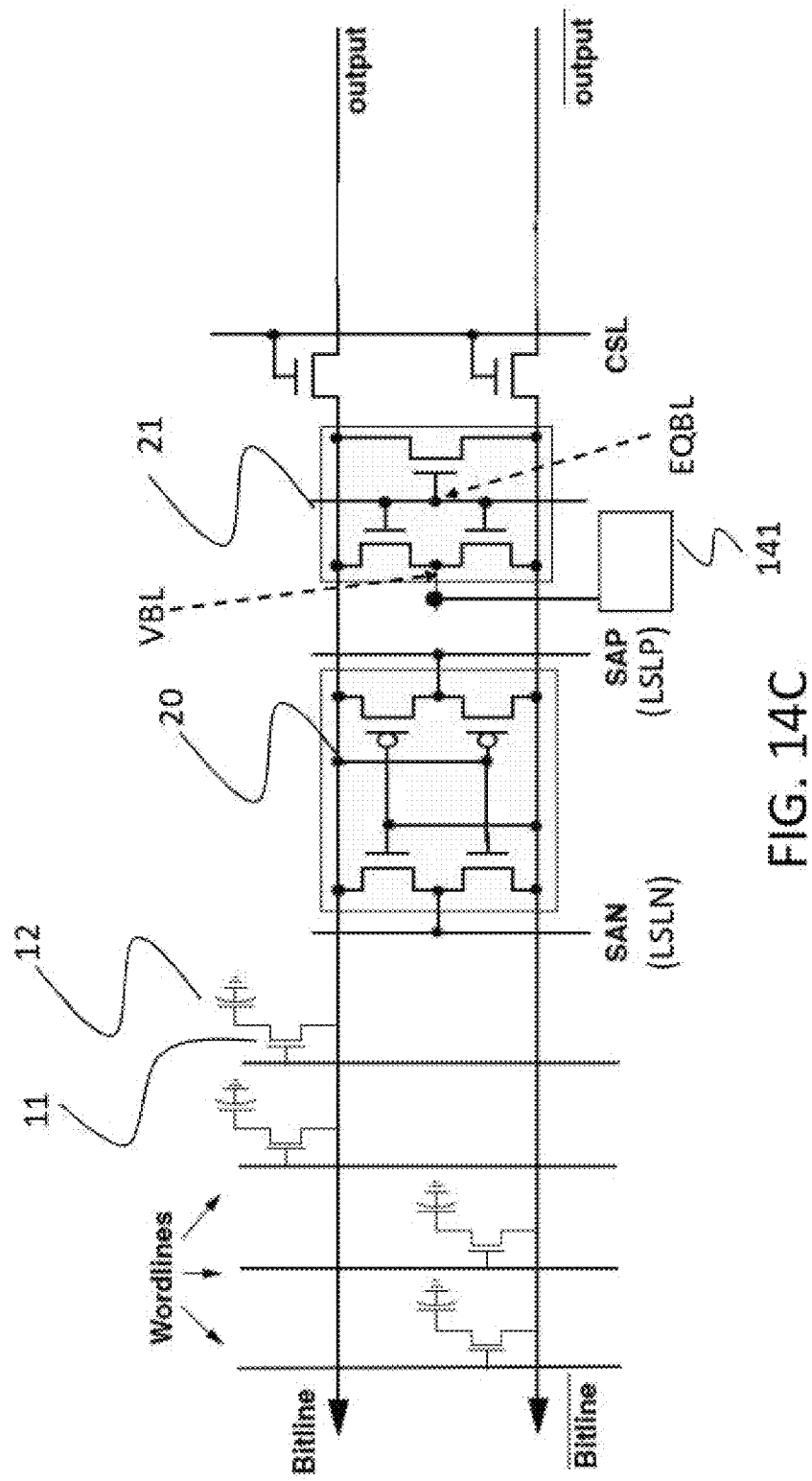
FIG. 14C illustrates the DRAM circuit according to the present invention, wherein a clean up circuit is coupled to the voltage equalization circuit.

As shown in FIG. 14A which is similar to FIG. 1C, since both the sense amplifier circuit 20 and the voltage equalization circuit 21 are coupled to the bitline ("BL") and the bitline ("BLB"), the clean up circuit 141 would be coupled to the sense amplifier circuit 20 (as shown in FIG. 14B) or the voltage equalization circuit 21 (as shown in FIG. 14C), and the clean up circuit 141 could be activated to cleanup the excessive voltage during the equalization period EQBL.

Figure 15A:
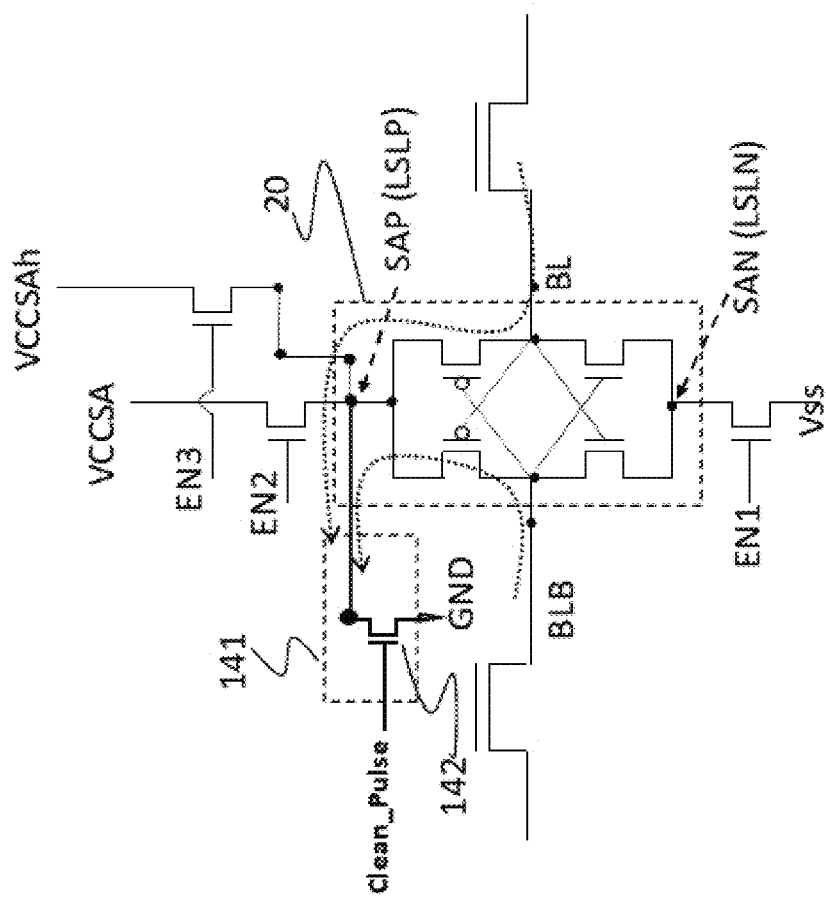
FIG. 15A illustrates the DRAM circuit according to the present invention, wherein the clean up circuit comprising a switch circuit coupled to SAP point of the sense circuit and the ground.

For example, in FIG. 15A, the clean up circuit 141 includes a switch circuit 142 coupled to the SAP (or LSLP) point of the sense amplifier circuit 20 and the ground (or other predetermined voltage level). Because the BL/BLB are coupled to the SAP (or LSLP) point through two P type transistors ("PFets") of the sense amplifier circuit 20, the aforesaid excess voltage (V1−targeted VBL) will be reduced and the corresponding excess charges will be discharged through the dot lines shown in FIG. 15A to the ground when the switch circuit 142 is activated by the clean up pulse (Clean Pulse) during the equalization period EQBL. Therefore, at the end of the clean up pulse, the voltage of BL and BLB will be set to the targeted VBL.

Figure 15B:
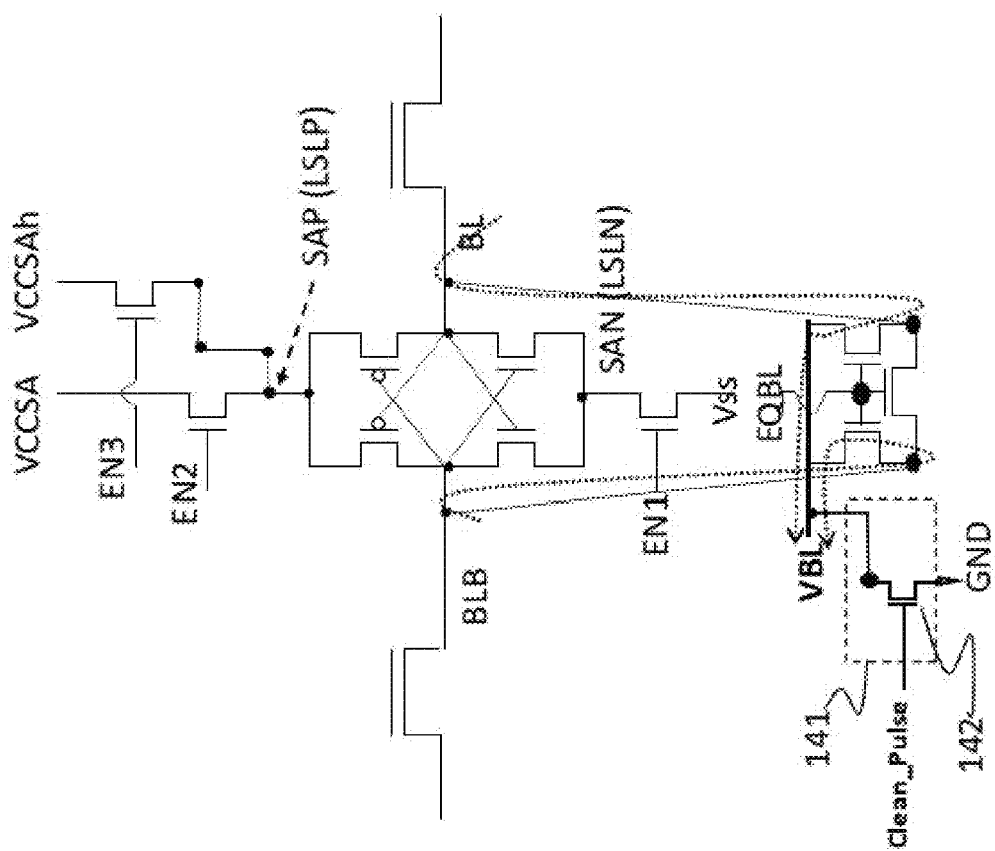
FIG. 15B illustrates the DRAM circuit according to the present invention, wherein the clean up circuit comprising a switch circuit coupled to VBL point of the voltage equalization circuit and the ground.

In another example shown in FIG. 15B, the cleanup circuit 141 includes the switch circuit 142 coupled to the VBL point of the voltage equalization circuit 21 and the ground (or other predetermined voltage level). Because the BL/BLB are coupled to the VBL point through two transistors of the voltage equalization circuit 21, the aforesaid excess voltage (V1−targeted VBL) will be reduced and the corresponding excess charges will be discharged through the dot lines shown in FIG. 15B to the ground when the switch circuit 142 is activated by the clean up pulse (Clean Pulse) during the equalization period EQBL. Therefore, at the end of the clean up pulse, the voltage of BL and BLB will be set to the targeted VBL.

Actually, the clean up circuit 141 could be coupled to any locations (such as the point SAN or LSLN) which can clean up the excessive voltage during equalization. For example, the clean up circuit 141 could be electrically coupled to, directly or indirectly, the BL and BLB during the equalization period, such that the clean up circuit mitigates the difference between the voltage of BL (or the voltage of BLB) and the targeted VBL during the equalization period.

Moreover, the proposed clean up circuit could be applied to the DRAM circuit, even though there is no kick up voltage applied during the restore period, as long as there is difference between the V1 and the targeted VBL. For example, in the event V1>targeted VBL, that is, ½(the voltage of BL+the voltage of BLB) at the beginning of equalization is higher than the targeted VBL, the voltage of BL and the voltage of BLB will be pulled down with the help of the clean up circuit because the BL and the BLB could be coupled to ground (or other predetermined low voltages) through the clean up circuit during the period of the clean up pulse. Therefore, after the end of the period of the clean up pulse, the voltage of BL and the voltage of BLB are set to the targeted VBL.

Figure 15C:
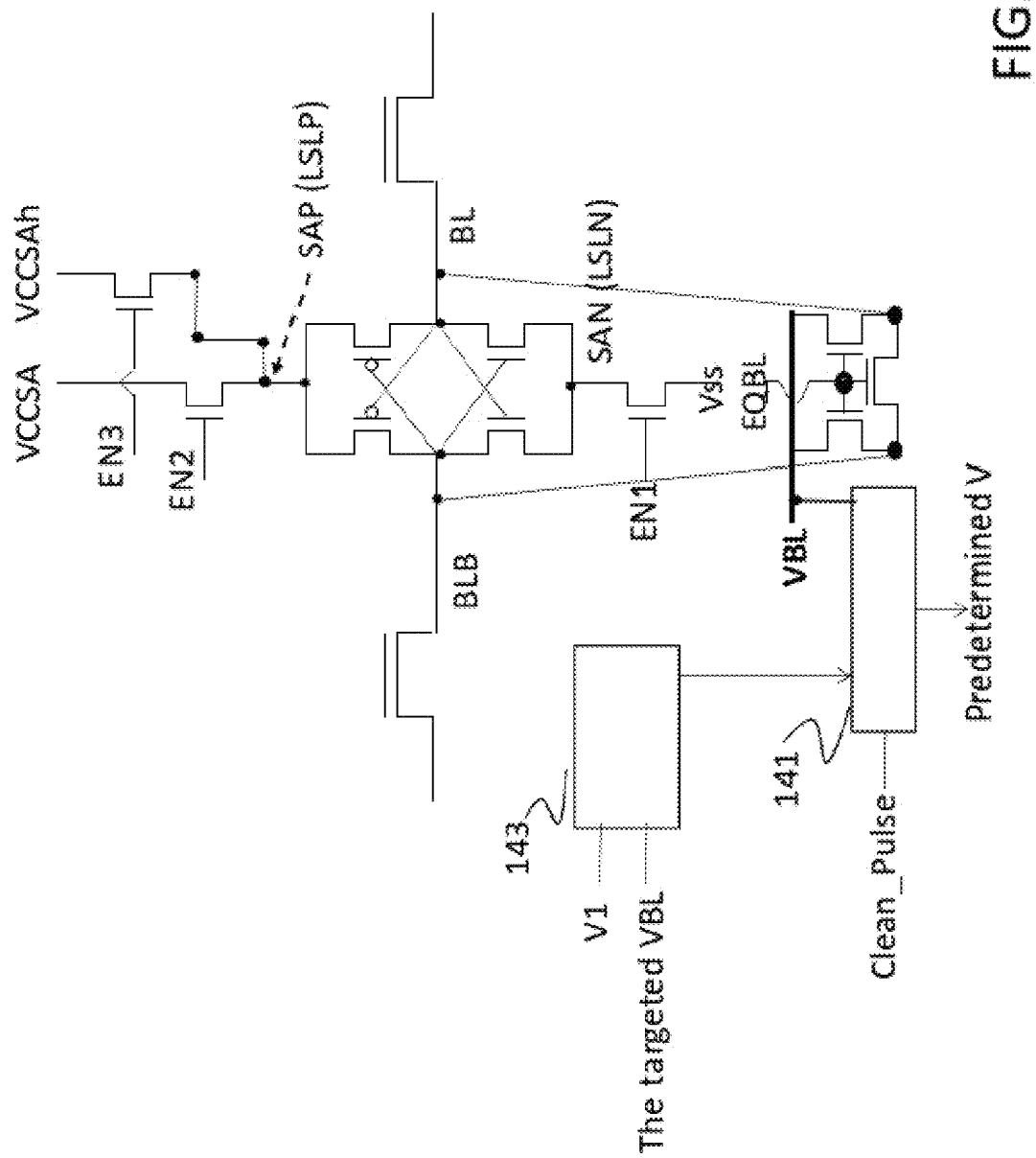
FIG. 15C illustrates the DRAM circuit according to the present invention, wherein a comparator circuit is coupled to the clean up circuit.

On the other hand, in the event V1<targeted VBL, that is, ½(the voltage of BL+the voltage of BLB) at the beginning of equalization is lower than the targeted VBL, the voltage of BL and the voltage of BLB will be pulled up with the help of the clean up circuit because the BL and the BLB could be coupled to VCCSA (or other predetermined high voltages) through the cleanup circuit during the period of the clean up pulse. Therefore, after the end of the period of the clean up pulse, the voltage of BL and the voltage of BLB are set to the targeted VBL. A comparator circuit 143 (shown in FIG. 15C) could be used to compare the V1 (or ½(the voltage of BL and the voltage of BLB)) with the targeted VBL (or a preset reference voltage). For example, the comparator circuit 143 receives the voltage of BL, the voltage of BLB and the targeted VBL at the beginning of the equalization period and compares the value of ½(the voltage of BL and the voltage of BLB) with the targeted VBL. If V1 is not equal to the targeted VBL, the comparator circuit 143 will send a control signal to the clean up circuit 141 which will then be activated by the clean up pulse during the equalization. In one embodiment, the width of the clean up pulse is not greater than that of the equalization period. Thus, after the end of the equalization period, the voltage of BL and the voltage of BLB are set to the targeted VBL.

To summarize the statements mentioned above, this invention discloses DRAM with sustainable storage architecture. A first sustaining voltage which is higher than the voltage level of signal ONE could be restored or stored to the DRAM storage cell before the access transistor of the DRAM storage cell is OFF (or the word-line coupled to the DRAM storage cell is OFF). Also a second sustaining voltage source which is lower than the voltage level of signal ZERO could be restored or stored to DRAM storage cell before the access transistor of the DRAM storage cell is OFF (or the word-line coupled to the DRAM storage cell is OFF). Thus, after the turn off of the access transistor, the storage capacitor can sustain for a longer period compared with conventional DRAM structure even if there is leakage current through the access transistor. Moreover, a clean up circuit is provided to clean up the excess voltage during the during equalization, such that the correct bit lines equalization voltage level and the correct developed voltage by the next active command can be achieved.

Although the present invention has been illustrated and described with reference to the embodiments, it is to be understood that the invention is not to be limited to the disclosed embodiments, but on the contrary, is intended to cover various modifications and equivalent arrangements included within the spirit and scope of the appended claims.

What is claimed is:
1. A DRAM chip, comprising:
   a first sustaining voltage generator producing a first voltage level which is higher than a voltage level of the signal ONE utilized in the DRAM chip;
   a first supplying voltage source generating the voltage level corresponding to signal ONE utilized in the DRAM chip, wherein the first sustaining voltage generator and the first supplying voltage source are physically separate each other;
   a DRAM cell comprising an access transistor and a storage capacitor;
   a sense amplifier coupled to a bit line and a complementary bit line, wherein the bit line is coupled to the storage capacitor through the access transistor; wherein the sense amplifier is selectively coupled to the first sustaining voltage generator and the first supplying voltage source and does not simultaneously receive the voltage level and the first voltage level;

an equalization circuit coupled to the bit line and the complementary bit line, wherein the equalization circuit couples the bit line and the complementary bit line to a preset reference voltage during an equalization period; and a clean up circuit coupled to the sense amplifier or the equalization circuit;

wherein the first sustaining voltage generator is electrically coupled to the bit line during a turning-off period of the access transistor, and the clean up circuit generates a clean up pulse to mitigate a difference between a voltage of the bit line and a preset reference voltage during the equalization period, a width of the clean up pulse depends on a restore voltage, and the restore voltage is higher than a voltage level of a signal ONE utilized in the DRAM chip.

2. The DRAM chip in claim 1, further comprising a word line coupled to a gate terminal of the access transistor, wherein the word-line is selected to turn on the access transistor for a first period and a second period which is after the first period, and the first sustaining voltage generator is electrically coupled to the bit line during the second period.

3. The DRAM chip in claim 2, wherein the first sustaining voltage generator is electrically coupled to the sense amplifier during the second period, and the first sustaining voltage generator is electrically coupled to the storage capacitor of the DRAM cell through the sense amplifier and the bit line.

4. The DRAM chip in claim 2, wherein the first period is an access operation period, and the second period is a restore phase period.

5. The DRAM chip in claim 4, wherein a kicking charge source is electrically coupled to the bit line during the access operation period.

6. The DRAM chip in claim 2, wherein the first period comprises a first kick period and a second kick period separate from the first kick period, a kicking charge source is coupled to the bit line during the first kick period, or coupled to the bit line during the first kick period and the second kick period.

7. The DRAM chip in claim 6, wherein the voltage level of kicking charge source is smaller than that of the first sustaining voltage generator.

8. The DRAM chip in claim 2, wherein the word-line is selected to turn on the access transistor for the first period and the second period according to a refresh operation.

9. The DRAM chip in claim 8, wherein a kicking charge source is electrically coupled to the bit line for a kick period which is prior to the first period, and the first sustaining voltage generator is electrically coupled to the bit line for all the second period.

10. The DRAM chip in claim 9, wherein the second period is at least 20% of the sum of the kick period, the first period and the second period.

11. The DRAM chip in claim 9, wherein the second period is at least 50% of the sum of the kick period, the first period and the second period.

12. The DRAM chip in claim 1, wherein the equalization period is after the turning-off period of the access transistor, and the clean up circuit is activated during equalization period such that the voltage of the bit line is equal to the preset reference voltage after the equalization period.

13. The DRAM chip in claim 12, wherein the clean up circuit is activated by a clean up pulse, and a width of the clean up pulse is not greater than that of the equalization period.

14. The DRAM chip in claim 12, wherein the clean up circuit is activated by a clean up pulse, and a rising edge of the clean up pulse is substantially aligned with a rising edge of the equalization period.

15. The DRAM chip in claim 1, wherein the clean up circuit comprising a switch circuit coupled to the sense amplifier and a predetermined voltage.

16. The DRAM chip in claim 1, wherein the clean up circuit comprising a switch circuit coupled to the equalization circuit and a predetermined voltage.

17. A DRAM chip, comprising:
a DRAM cell comprising an access transistor and a storage capacitor;
a sense amplifier coupled to a bit line and a complementary bit line, wherein the bit line is coupled to the storage capacitor through the access transistor;
an equalization circuit coupled to the bit line and the complementary bit line, wherein the equalization circuit couples the bit line and the complementary bit line to a preset reference voltage during an equalization period; and
a clean up circuit electrically coupled to the bit line and the complementary bit line during the equalization period;
wherein the clean up circuit generates a clean up pulse to mitigate a difference between a voltage of the bit line and a preset reference voltage during the equalization period, a width of the clean up pulse depends on a restore voltage, and the restore voltage is higher than a voltage level of a signal ONE utilized in the DRAM chip.

18. The DRAM chip in claim 17, wherein the voltage of the bit line is equal to the preset reference voltage after the equalization period.

19. The DRAM chip in claim 17, the clean up circuit electrically coupled to the bit line and the complementary bit line during the equalization period through the sense amplifier or the equalization circuit.

20. The DRAM chip in claim 19, wherein the clean up circuit comprising a switch circuit coupled to the sense amplifier and a predetermined voltage.

21. The DRAM chip in claim 19, wherein the clean up circuit comprising a switch circuit coupled to the equalization circuit and a predetermined voltage.

22. The DRAM chip in claim 17, wherein the clean up circuit is activated by the clean up pulse during the equalization period, and a rising edge of the clean up pulse is substantially aligned with a rising edge of the equalization period.

23. The DRAM chip in claim 17, further comprising a comparator circuit receiving the voltage of the bit line, the voltage of the complementary bit line and the preset reference voltage at the beginning of or during the equalization period, and sends a control signal to the clean up circuit in the event one half of a sum of the voltage of the bit line and the voltage of the complementary bit line is not equal to preset reference voltage.

* * * * *